(12) United States Patent
Lius et al.

(10) Patent No.: US 12,408,539 B2
(45) Date of Patent: Sep. 2, 2025

(54) DISPLAY DEVICE

(71) Applicant: InnoLux Corporation, Miao-Li County (TW)

(72) Inventors: Chandra Lius, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 421 days.

(21) Appl. No.: 18/106,490

(22) Filed: Feb. 7, 2023

(65) Prior Publication Data

US 2023/0292578 A1  Sep. 14, 2023

(30) Foreign Application Priority Data

Mar. 14, 2022  (CN) .......................... 202210248125.0

(51) Int. Cl.
| | |
|---|---|
| *H10K 59/80* | (2023.01) |
| *G02B 3/00* | (2006.01) |
| *G06V 40/13* | (2022.01) |
| *H10K 59/12* | (2023.01) |
| *H10K 59/35* | (2023.01) |

(52) U.S. Cl.
CPC ......... *H10K 59/879* (2023.02); *G02B 3/0012* (2013.01); *G06V 40/1318* (2022.01); *H10K 59/12* (2023.02); *H10K 59/351* (2023.02)

(58) Field of Classification Search
None
See application file for complete search history.

(56) References Cited

U.S. PATENT DOCUMENTS

| | | | |
|---|---|---|---|
| 2020/0066809 A1 | 2/2020 | Liu | |
| 2020/0251675 A1* | 8/2020 | Zhang | ................. H10K 50/115 |
| 2021/0202606 A1 | 7/2021 | Kim | |
| 2021/0202664 A1 | 7/2021 | Kim | |
| 2021/0202917 A1 | 7/2021 | Lee | |
| 2022/0255045 A1 | 8/2022 | Yamazaki | |

FOREIGN PATENT DOCUMENTS

| | | |
|---|---|---|
| CN | 113994494 A | 1/2022 |
| TW | 201839977 A | 11/2018 |

* cited by examiner

*Primary Examiner* — Donald L Raleigh
(74) *Attorney, Agent, or Firm* — Winston Hsu

(57) ABSTRACT

The present disclosure provides a display device including a display panel and a lens layer. The display panel has a normal region and a camera region, in which the normal region includes a plurality of first light emitting units, and the camera region includes a plurality of second light emitting units. The lens layer is disposed on the normal region and the camera region, and the lens layer includes a plurality of first lenses overlapped with the first light emitting units and a plurality of second lenses overlapped with the second light emitting units. A density of the first lenses in the normal region is greater than a density of the second lenses in the camera region.

14 Claims, 19 Drawing Sheets

DISPLAY DEVICE

BACKGROUND OF THE DISCLOSURE

1. Field of the Disclosure

The present disclosure relates to a display device and particularly to a display device having lenses.

2. Description of the Prior Art

With electronic devices have diversified functions, they have become necessary tools in people's lives. Recently, the electronic device with a display function is developed to have a great screen-to-body ratio. However, when the electronic device has a camera or a fingerprint sensor, the camera or the fingerprint sensor will occupy a part of front panel of the electronic device, so as to limit a display region and the screen-to-body ratio of the electronic device. Therefore, how to integrate the camera or the fingerprint sensor into the display region is the biggest challenge in increasing the screen-to-body ratio.

SUMMARY OF THE DISCLOSURE

According to an embodiment of the present disclosure, a display device is provided and includes a display panel and a lens layer. The display panel has a normal region and a camera region, in which the normal region includes a plurality of first light emitting units, and the camera region includes a plurality of second light emitting units. The lens layer is disposed on the normal region and the camera region, and the lens layer includes a plurality of first lenses overlapped with the first light emitting units and a plurality of second lenses overlapped with the second light emitting units. A density of the first lenses in the normal region is greater than a density of the second lenses in the camera region.

These and other objectives of the present disclosure will no doubt become obvious to those of ordinary skill in the art after reading the following detailed description of the embodiment that is illustrated in the various figures and drawings.

DETAILED DESCRIPTION

Figure 1:
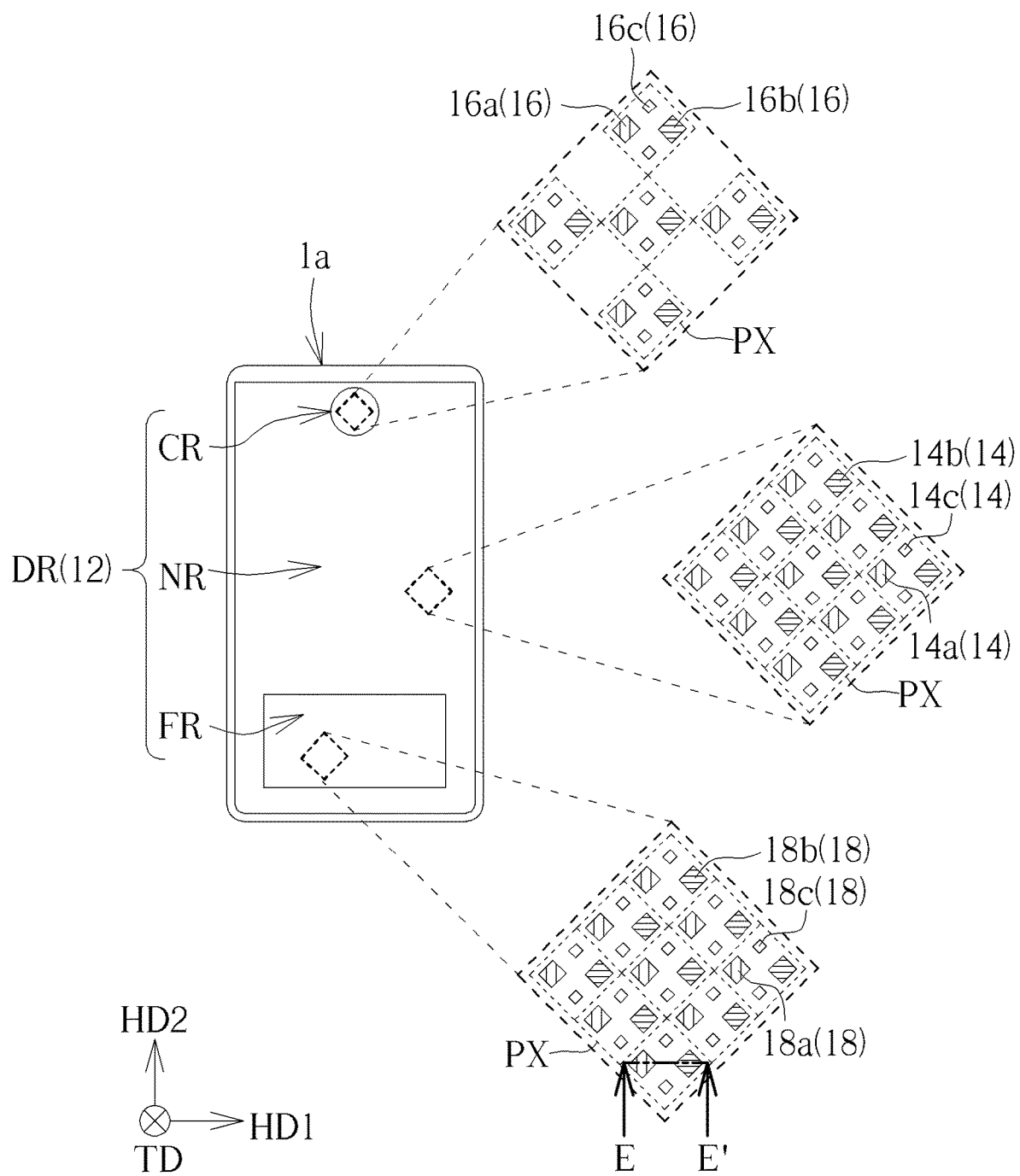
FIG. 1 schematically illustrates a top view of a display device according to an embodiment of the present disclosure.

The contents of the present disclosure will be described in detail with reference to specific embodiments and drawings. It is noted that, for purposes of illustrative clarity and being easily understood by the readers, the following drawings may be simplified schematic diagrams, and elements therein may not be drawn to scale. The numbers and sizes of the elements in the drawings are just illustrative and are not intended to limit the scope of the present disclosure.

Certain terms are used throughout the specification and the appended claims of the present disclosure to refer to specific elements. Those skilled in the art should understand that electronic equipment manufacturers may refer to an element by different names, and this document does not intend to distinguish between elements that differ in name but not function. In the following description and claims, the terms "comprise", "include" and "have" are open-ended fashion, so they should be interpreted as "including but not limited to . . . ".

The ordinal numbers used in the specification and the appended claims, such as "first", "second", etc., are used to describe the elements of the claims. It does not mean that the element has any previous ordinal numbers, nor does it represent the order of a certain element and another element, or the sequence in a manufacturing method. These ordinal numbers are just used to make a claimed element with a certain name be clearly distinguishable from another claimed element with the same name. Thus, a first element mentioned in the specification may be called a second element.

Spatially relative terms, such as "above", "on", "beneath", "below", "under", "left", "right", "before", "front", "after", "behind" and the like, used in the following embodiments just refer to the directions in the drawings and are not intended to limit the present disclosure. It may be understood that the elements in the drawings may be disposed in any kind of formation known by those skilled in the related art to describe or illustrate the elements in a certain way. Furthermore, when one element is mentioned to overlap another element, it may be understood that the element may partially or completely overlap the another element.

In addition, when one element or layer is "on" or "above" another element or layer or is "connected to" the another element or layer, it may be understood that the element or layer is directly on the another element or layer or directly connected to the another element or layer, and alternatively, another element or layer may be between the element or layer and the another element or layer (indirectly). On the contrary, when the element or layer is "directly on" the another element or layer or is "directly connected to" the another element or layer, it may be understood that there is no intervening element or layer between the element or layer and the another element or layer.

As disclosed herein, the terms "approximately", "essentially", "about", or "substantially" generally mean within 10%, 5%, 3%, 2%, 1%, or 0.5% of the reported numerical value or range. The quantity disclosed herein is an approximate quantity, that is, without a specific description of "approximately", "essentially", "about", or "substantially", the quantity may still include the meaning of "approximately", "essentially", "about", or "substantially".

It should be understood that according to the following embodiments, features of different embodiments may be replaced, recombined or mixed to constitute other embodiments without departing from the spirit of the present disclosure. The features of various embodiments may be mixed arbitrarily and used in different embodiments without departing from the spirit of the present disclosure or conflicting.

In the present disclosure, the length, thickness, width, or depth may be measured by using an optical microscope (OM), a scanning electron microscope (SEM) or other approaches, but not limited thereto.

Unless otherwise defined, all terms (including technical and scientific terms) used herein have the same meaning as commonly understood by those skilled in the art. It should be understood that these terms, such as those defined in commonly used dictionaries, should be interpreted as having meaning consistent with the relevant technology and the background or context of the present disclosure, and should not be interpreted in an idealized or excessively formal way, unless there is a special definition in the embodiments of the present disclosure.

In the present disclosure, an electronic device may have a display function and may optionally include an optical sensing, image detecting, biometric feature identifying, touching sensing, or antenna function, other suitable functions or any combination thereof, but not limited thereto. In some embodiments, the electronic device may include tiled device, but not limited thereto. The electronic device may include liquid crystal molecule, light emitting diode (LED), quantum dot material, a fluorescent material, a phosphor material, other suitable materials, or any combination thereof, but not limited thereto. The LED may for example include organic light emitting diode (OLED), micro light emitting diode (micro-LED) or mini light emitting diode (mini-LED), or quantum dot light emitting diode (e.g., QLED or QDLED), but not limited thereto. In addition, the electronic device may be a color display device, a monochromatic display device, or a grayscale display device. The appearance of the electronic device may be rectangular, circular, polygonal, a shape with curved edges, curved or other suitable shapes, but not limited thereto. The electronic device may optionally have peripheral systems such as a driving system, a control system, a light source system, a shelf system, etc.

Please refer to FIG. 1, which schematically illustrates a top view of a display device according to an embodiment of the present disclosure. As shown in FIG. 1, the display device 1a provided in this embodiment may include a display panel 12 for displaying images, and the display device 1a may have a display surface 1S for displaying an image. The display panel 12 may have a display region DR for defining a size of the image, that is, the image may be displayed from the display region DR. In the embodiment of FIG. 1, the display region DR of the display panel 12 may have a normal region NR, a camera region CR, and a fingerprint sensing region FR, wherein the normal region NR may include a plurality of light emitting elements 14, the camera region CR may include a plurality of light emitting elements 16, and the fingerprint sensing region FR may include a plurality of light emitting elements 18. The camera region CR may be configured to display the image and allow image detection through the camera region CR. The fingerprint sensing region FR may be configured to display the image and allow fingerprint image detection through the fingerprint sensing region FR. The normal region NR may be configured to display the image, and the normal region NR may be a region outside the camera region CR and the fingerprint sensing region FR that is able to display the image. As shown in FIG. 1, a density of the light emitting elements 14 in the normal region NR may be greater than a density of the light emitting elements 16 in the camera region CR, so that a space between the light emitting elements 16 in the camera region CR that allows light to pass through may be greater than that between the light emitting elements 14 in the normal region NR that allows light to pass through, such that an image may be detected through the camera region CR. In some embodiments, a density of the light emitting elements 18 in the fingerprint sensing region FR may be the same or less than a density of the light emitting elements 14 in the normal region NR, so that a fingerprint image may be detected through the fingerprint sensing region FR. In some embodiments, a density of the light emitting elements 18 in the fingerprint sensing region FR may be greater than a density of the light emitting elements 16 in the camera region CR, but not limited thereto.

In some embodiments, the display region DR of the display panel 12 may not have at least one of the camera region CR and the fingerprint sensing region FR, which may be replaced by the normal region NR. Alternatively, when an entire front surface of the display device 1a may have a fingerprint sensing function, the fingerprint sensing region FR may replace the normal region NR in the display panel 12. In such case, the display panel 12 may have the fingerprint sensing region FR, or both the fingerprint sensing region FR and the camera region CR. It should be noted that the normal region NR, the camera region CR and the fingerprint sensing region FR in the present disclosure may refer to different portions of the display panel 12 in different regions and may include elements corresponding to the regions. For example, the camera region CR may refer to a portion of the display panel 12 corresponding to the camera region CR and may include elements in the display panel 12 corresponding to the camera region CR. Similarly, the above definition may be adapted to the normal region NR and the fingerprint sensing region FR.

As shown in FIG. 1, the light emitting elements 14 may include a light emitting element 14a, a light emitting element 14b and a light emitting element 14c respectively for generating light of different colors and serving as sub-pixels of different colors, but not limited thereto. For example, the light emitting element 14a, the light emitting element 14b and the light emitting element 14c may be used to generate blue, red and green light, respectively. Similarly, the light emitting elements 16 may include a light emitting element 16a, a light emitting element 16b, and a light emitting element 16c respectively for generating light of different colors and serving as sub-pixels of different colors. The light emitting elements 18 may include a light emitting element 18a, a light emitting element 18b and a light emitting element 18c respectively for generating light of different colors and serving as sub-pixels of different colors, but not limited thereto. In some embodiments, the light emitting elements 14 may generate light of the same color and be arranged with color conversion layers of different colors, such that the portion of the display device 1a corresponding to the normal region NR may generate a color image. The light emitting elements 16 and/or the light emitting elements 18 may also optionally generate light of the same color and be arranged with color conversion layers of different colors, such that the portion of the display device 1a corresponding to the camera region CR and/or the fingerprint sensing region FR may generate a color image. The color conversion layers may, for example, include quantum dot materials, fluorescent materials, phosphor materials, color filter materials, or other suitable color conversion materials.

In the embodiment of FIG. 1, a pixel arrangement of PenTile is as an example, in which one pixel PX in the normal region NR may include one light emitting element 14a, one light emitting element 14b and two light emitting elements 14c. In some embodiments, different light emitting elements may have different light emitting areas. For example, a light emitting area of the light emitting element 14a and/or a light emitting area of the light emitting element 14b may be greater than a light emitting area of the light emitting element 14c, but not limited thereto. Similarly, the pixels PX of the fingerprint sensing region FR and the camera region CR may also have the same or similar arrangement and/or size as the pixels PX of the normal region NR, but not limited thereto. In some embodiments, the sizes, number, colors and arrangement of the light emitting elements forming the pixels PX may be adjusted according to requirements.

Figure 2:
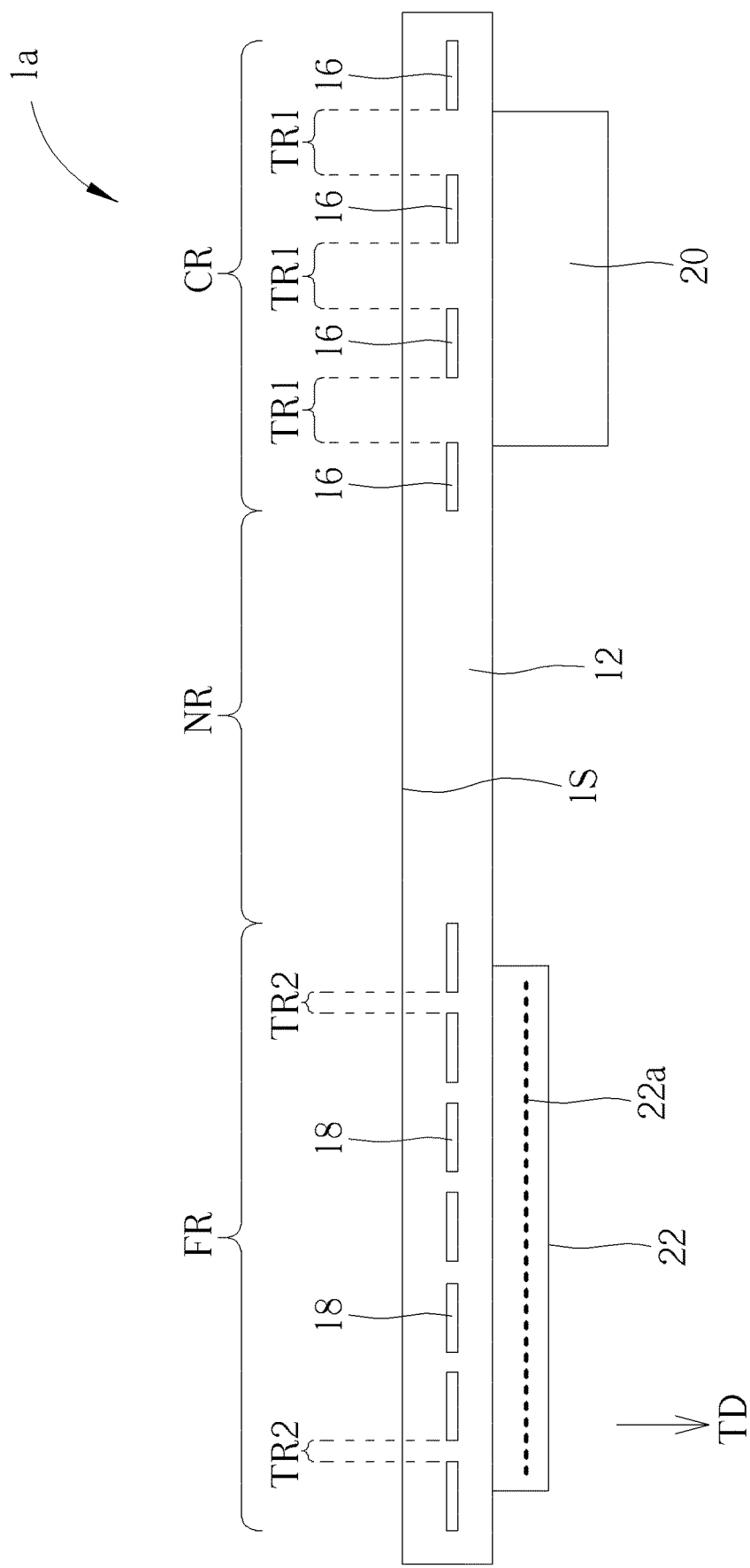
FIG. 2 schematically illustrates a sectional view of a display device according to an embodiment of the present disclosure.

Please refer to FIG. 2, which schematically illustrates a sectional view of a display device according to an embodiment of the present disclosure. In order to clearly show the camera region CR and the fingerprint sensing region FR, elements in the normal region NR are omitted in FIG. 2, but not limited thereto. As shown in FIG. 2, when the display panel 12 has the camera region CR, the display device 1a may further include a camera module 20 disposed under the display panel 12 and overlapped with the camera region CR. Specifically, the camera region CR may include a plurality of transmission areas TR1 to allow a light to pass through, and the camera module 20 may be overlapped with the transmission areas TR1 in a top view direction TD, so that the camera module 20 may capture image information through the transmission areas TR1. In some embodiments, a visible light transmittance of the transmission area TR1 may be, for example, greater than 50%, but not limited thereto. It should be noted that "overlapped" mentioned herein may refer to that two elements overlap each other in the top view direction TD of the display device 1a, wherein the top view direction TD may be, for example, a normal direction perpendicular to the display surface 1S.

When the display panel 12 has the fingerprint sensing region FR, the display device 1a may further include a fingerprint sensing module 22 disposed under the display panel 12 and used for detecting a fingerprint image. The fingerprint sensing module 22 may include, for example, a plurality of sensing units 22a for detecting light intensity. In the embodiment of FIG. 2, the fingerprint sensing region FR may include a plurality of transmission areas TR2 to allow a light to pass through, and the sensing units 22a of the fingerprint sensing module 22 may be overlapped with the transmission areas TR2, such that the fingerprint sensing module 22 may capture the fingerprint image through the transmission areas TR2 to identify a fingerprint. The sensing unit 22a may be configured to detect visible light or invisible light. For example, the invisible light may include infrared light, ultraviolet light, or other suitable light. The sensing unit 22a may include, for example, a photodiode, a phototransistor, or other suitable optical sensing elements.

It should be noted that, in the present disclosure, the transmission areas TR1 may refer to regions of the camera region CR that are located outside the light emitting elements 16 (or without the light emitting elements 16) and allow light to pass through, and the transmission areas TR2 may refer to regions of the fingerprint sensing region FR that are located outside the light emitting elements 18 (or without the light emitting elements 18) and allow light to pass through. The term "regions located outside an element" refers to regions that are overlapped with the element in the top view direction TD of the display panel 12. In addition, a relationship in position between the transmission areas TR1 and the light emitting elements 16 and a relationship in position between the transmission areas TR2 and the light emitting elements 18 shown in FIG. 2 are as an example, and their specific structure may refer to the following embodiments and related drawings.

Figure 3:
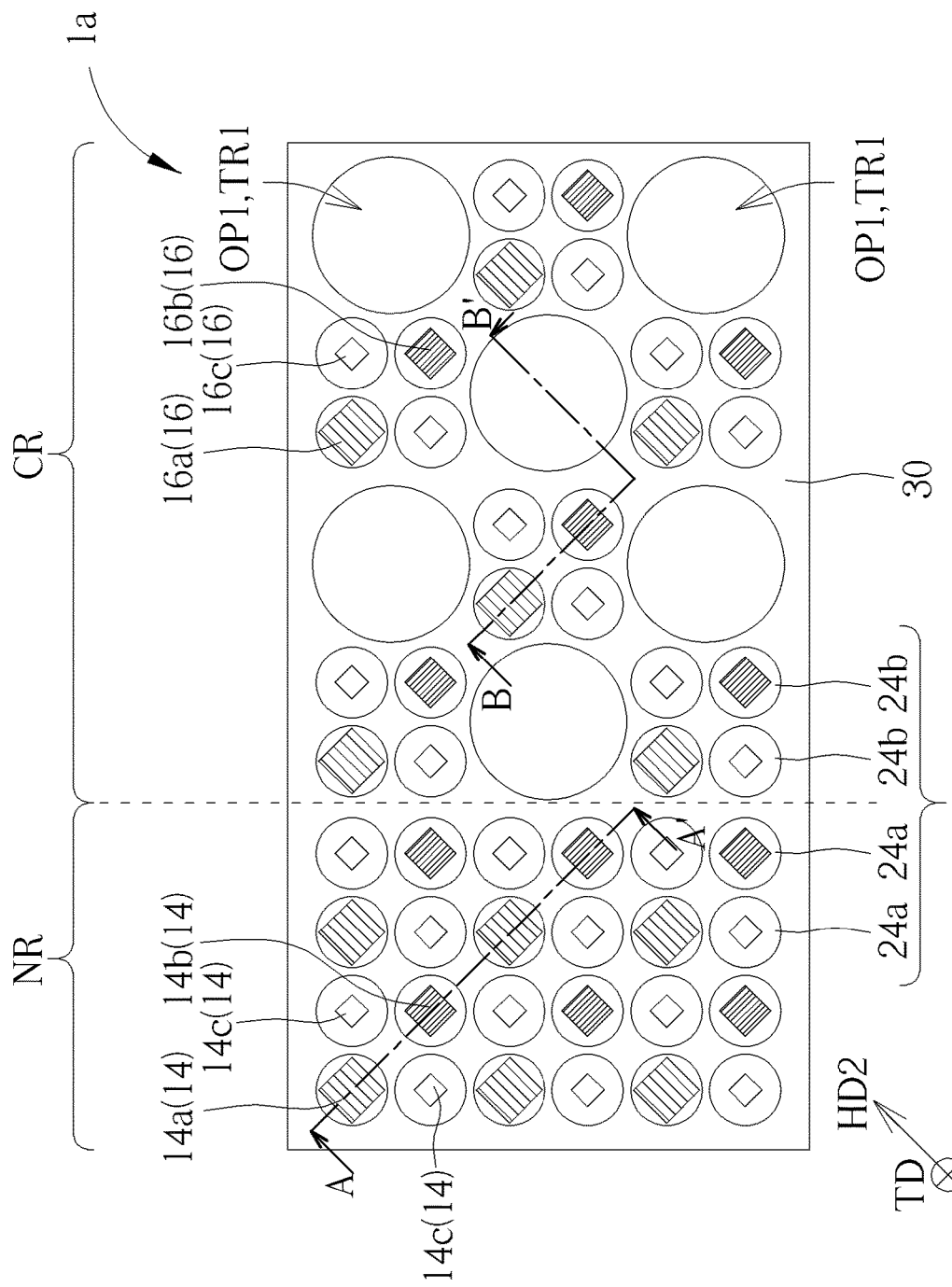
FIG. 3 schematically illustrates a top view of a portion of the display device corresponding to the normal region and the camera region according to an embodiment of the present disclosure.
Figure 4:
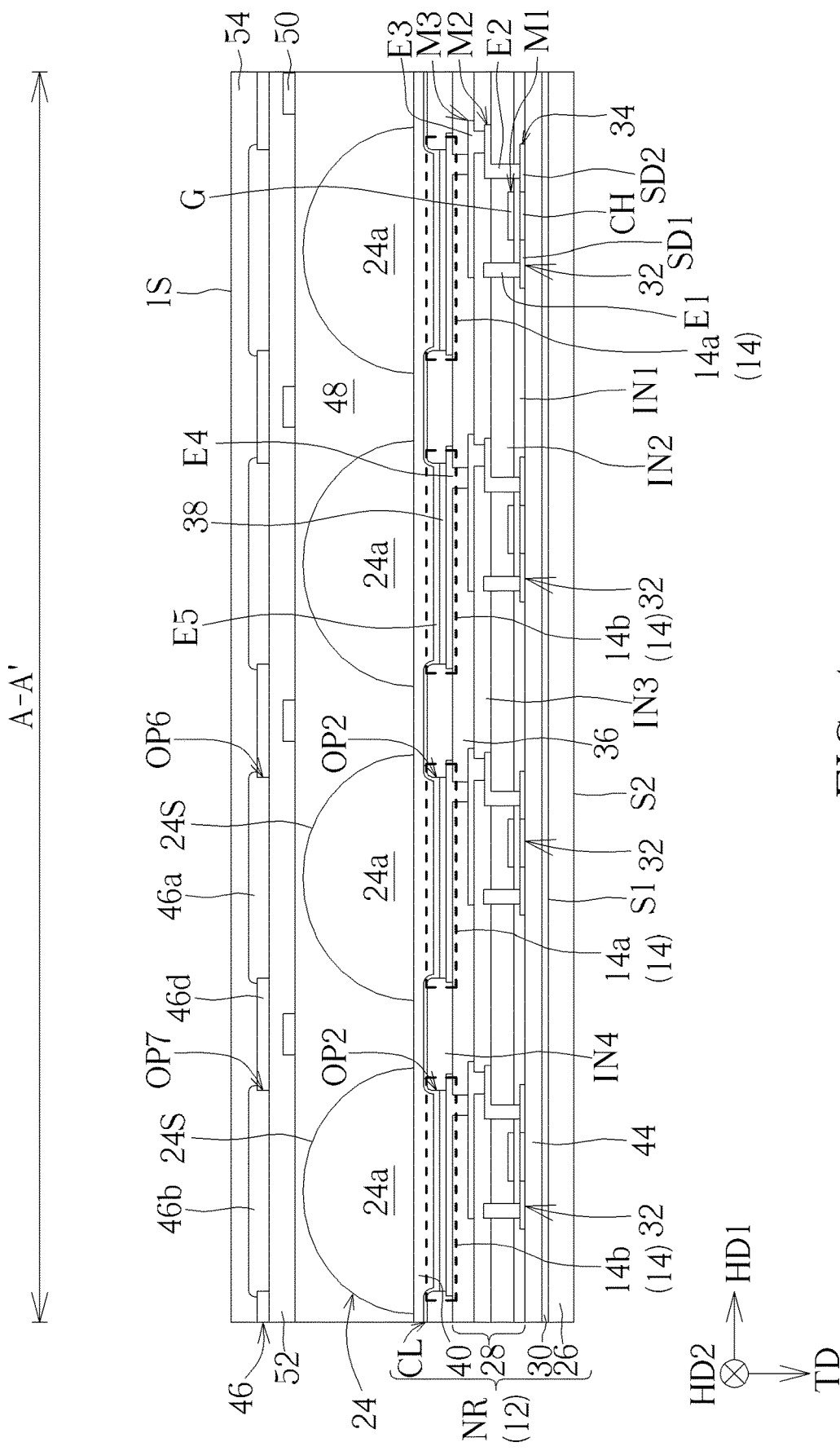
FIG. 4 is a sectional view taken along a sectional line A-A' of FIG. 3.
Figure 5:
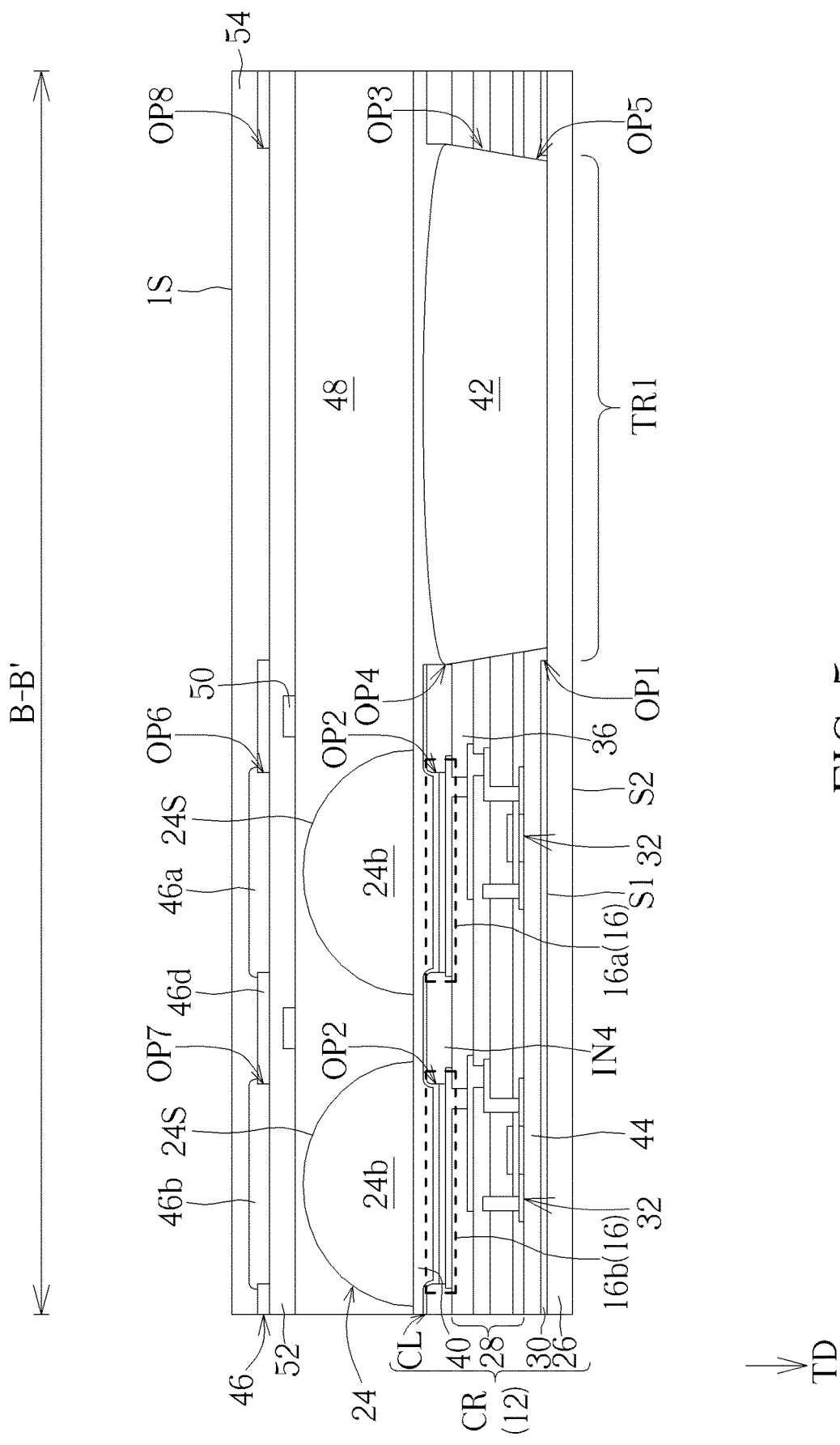
FIG. 5 schematically illustrates a sectional view taken along a sectional line B-B' of FIG. 3.

A structure of the display device corresponding to the normal region NR and the camera region CR will be further detailed in the following description. In order to clearly show main features of the present disclosure, the following drawings illustrate a part of the structure of the display device, but not limited thereto. Please refer to FIG. 3 to FIG. 5. FIG. 3 schematically illustrates a top view of a portion of the display device corresponding to the normal region and the camera region according to an embodiment of the present disclosure, FIG. 4 is a sectional view taken along a sectional line A-A' of FIG. 3, and FIG. 5 schematically illustrates a sectional view taken along a sectional line B-B' of FIG. 3, wherein the camera module is omitted in FIG. 3 to FIG. 5, but the present disclosure is not limited thereto. As shown in FIG. 3 to FIG. 5, the display device 1a of the present embodiment may further include a lens layer 24 disposed on the display panel 12 and used for increasing brightness of light generated by the display panel 12. In this embodiment, the lens layer 24 may be disposed on the normal region NR and the camera region CR, and the lens layer 24 may include a plurality of lenses 24a overlapped with the light emitting elements 14 and a plurality of lenses 24b overlapped with the light emitting elements 16. For example, each lens 24a may be overlapped with a corresponding one of the light emitting elements 14, and each lens 24b may be overlapped with a corresponding one of the light emitting elements 16, but not limited thereto. Since the density of the light emitting elements 14 in the normal region NR may be greater than the density of the light emitting elements 16 in the camera region CR, a density of the lenses 24a on the normal region NR may be greater than a density of the lenses 24b on the camera region CR. In the present disclosure, the "density of lenses" may refer to a number of the lenses counted in a region of 2 mm by 2 mm viewed along the top view direction TD that is arbitrarily taken in the normal region NR, the camera region CR or the fingerprint sensing region FR, and the number of lenses may represent the density of the lenses. It should be noted that the lenses 24a and the lenses 24b may respectively focus the light generated by the light emitting elements 14 and the light emitting elements 16 toward the display surface 1S of the display device 1a, thereby improving the brightness of each sub-pixel of the display device 1a. For example, the lenses 24a and the lenses 24b may be convex lenses or other suitable lens types. In some embodiments, the lenses 24a and the lenses 24b may be spaced apart from each other to reduce light mixing between sub-pixels. In some embodiments, the lens 24a and the lens 24b may, for example, have the same or different refractive indices based on requirements.

In the embodiments of FIG. 3 to FIG. 5, when viewed along the top view direction TD, the lenses 24a corresponding to different light emitting elements (e.g., two of the light emitting element 14a, the light emitting element 14b and the light emitting element 14c) in the normal region NR may, for example, have substantially the same top view size. For instance, two of the lenses 24a may have the same width in a horizontal direction (e.g., a horizontal direction HD1 or a horizontal direction HD2), but not limited thereto. Similarly, the lenses 24b corresponding to different light emitting elements (e.g., two of the light emitting element 16a, the light emitting element 16b, and the light emitting element 16c) in the camera region CR may also have substantially the same top view size. For example, two of the lenses 24b may have the same width in the horizontal direction, but not limited thereto. In addition, the lens 24a and the lens 24b may, for example, have substantially the same top view size, such as the same width in the horizontal direction, but not limited thereto. It should be noted that the "width of the lens" mentioned herein may refer to a width of bottom of the lens, and the width of the bottom of the lens may refer to as a maximum width along a sectional line passing through a center point of the lens. Furthermore, the comparison of the widths of the lenses may be based on the maximum widths. For example, the width of the lens 24a may be the maximum width of a portion of the lens on the sectional line A-A' along the horizontal direction HD1, and the width of the lens 24b may be the maximum width of a portion of the lens on a sectional line B-B' along the horizontal direction HD1, but not limited thereto. The horizontal direction HD1 and the horizontal direction HD2 may be, for example, perpendicular to each other and may be directions perpendicular to the top view direction TD.

In some embodiments, a radius of curvature of the upper surface 24S of the lens 24a and/or a radius of curvature of the upper surface 24S of the lens 24b may be adjusted according to requirements. For example, a thickness of the lens layer 24 in the top view direction TD may be reduced by increasing the radius of curvature of the upper surface 24S of the lens 24a, thereby reducing a thickness of the display device 1a.

Figure 7:
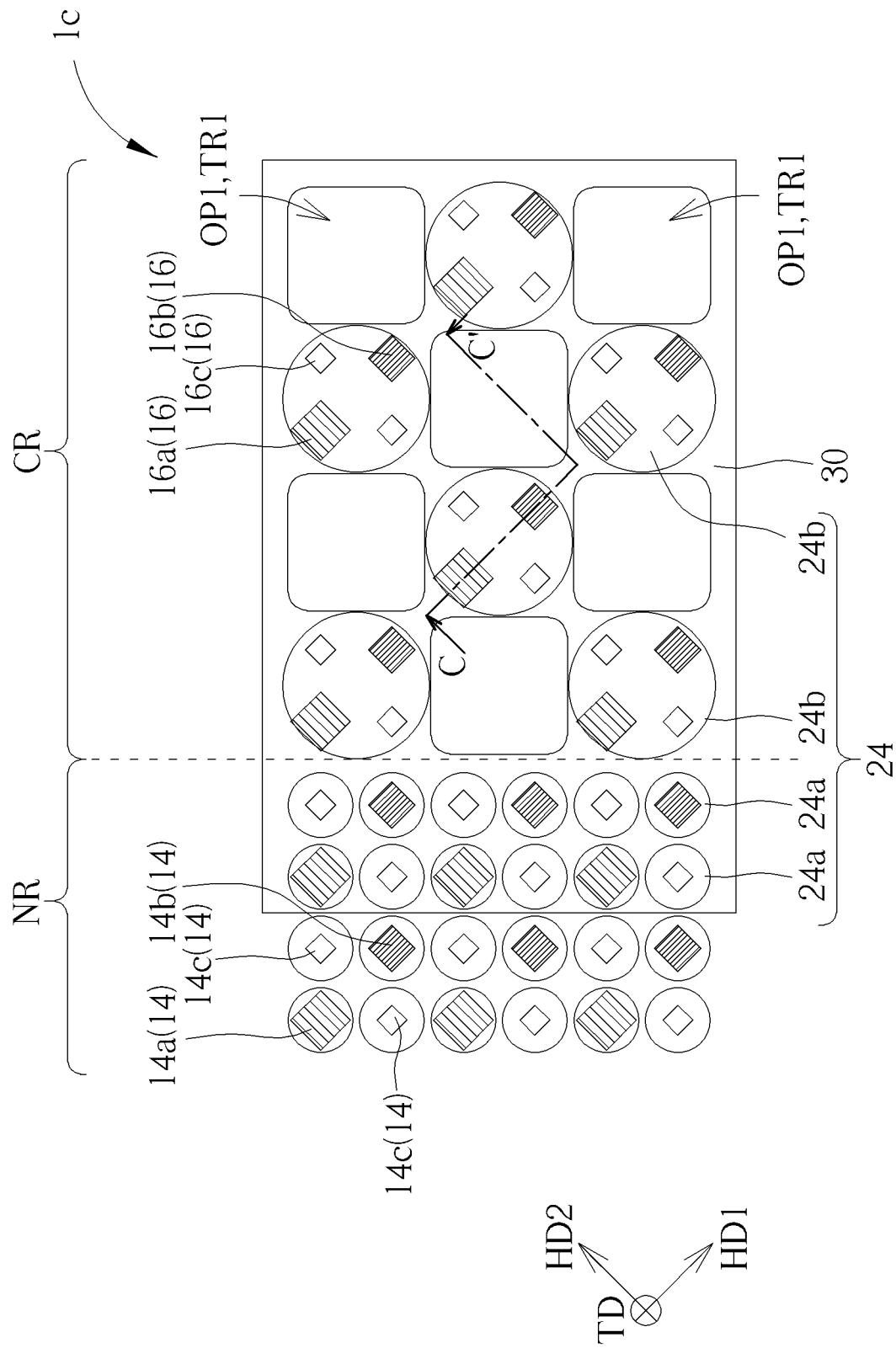
FIG. 7 schematically illustrates a top view of a portion of the display device corresponding to a normal region and a camera region according to another embodiment of the present disclosure.
Figure 9:
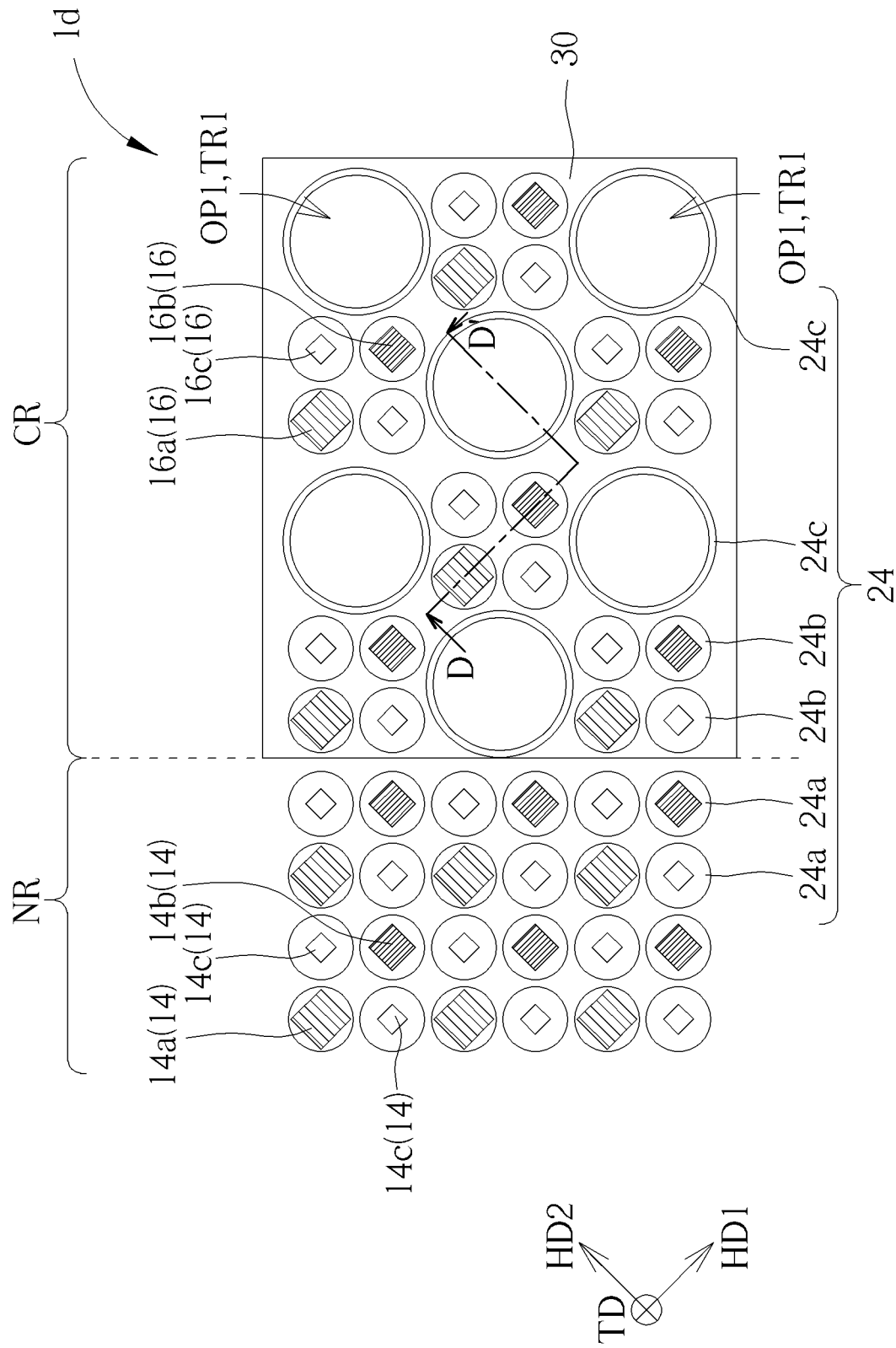
FIG. 9 schematically illustrates a top view of a portion of a display device corresponding to the normal region and the camera region according to another embodiment of the present disclosure.

The structure of the display panel 12 is further detailed in the following description, and the display panel 12 is a self-luminous display panel as an example, but not limited thereto. As shown in FIG. 4 and FIG. 5, the display panel 12 may include a substrate 26, a circuit layer 28 and a light shielding layer 30 disposed under the light emitting elements 14 and the light emitting elements 16. The substrate 26 may include a transparent substrate, a translucent substrate or an opaque substrate, or may include a flexible or rigid substrate. For example, the substrate 26 may include glass, quartz, plastic, or other substrate materials. The circuit layer 28 may be disposed between the substrate 26 and the light emitting elements, and the light shielding layer 30 may be disposed between the substrate 26 and the circuit layer 28. In other words, the light shielding layer 30, the circuit layer 28 and the light emitting elements (e.g., the light emitting elements 14 and the light emitting elements 16) may be disposed on the upper surface S1 of the substrate 26 in sequence. In some embodiments, the camera module 20 and/or the fingerprint sensing module 22 shown in FIG. 2 may be disposed on the lower surface S2 of the substrate 26, for example. It should be noted that, since ambient light or any light entering the display panel 12 from the camera region CR will enter from the display surface 1S of the display device 1a and pass through the display panel 12 to be reflected by the camera module 20 and/or the fingerprint sensing module 22, disposing the light shielding layer 30 between the substrate 26 and the circuit layer 28 may reduce or avoid photo leakage current of active elements in the circuit layer 28. In the embodiment of FIG. 3, the light shielding layer 30 may be disposed in the normal region NR and the camera region CR, and for example, may cover the substrate 26 of the normal region NR and the camera region CR. In some embodiments, since the reflected light is mainly located in the camera region CR and/or the fingerprint sensing region FR, the light shielding layer 30 may be disposed in the camera region CR and a part of the normal region NR adjacent to the camera region CR, as shown in FIG. 7. Alternatively, the light shielding layer 30 may not be disposed in the normal region NR, but may be disposed in the camera region CR, as shown in FIG. 9, but not limited thereto. The light shielding layer 30 may, for example, include metal or other suitable light shielding material.

As shown in FIG. 3 and FIG. 5, the light shielding layer 30 of the camera region CR may have a plurality of openings OP1 to allow light to be directed from the display surface 1S of the display device 1a to the lower surface S2 of the substrate 26, such that the camera module (e.g., the camera module 20 shown in FIG. 2) is capable of detecting images through the openings OP1. In the embodiment of FIG. 3 and FIG. 5, the opening OP1 may define, for example, the transmission area TR1. In other words, a size of the opening OP1 may be the same as a size of the transmission area TR1.

As shown in FIG. 4 and FIG. 5, the circuit layer 28 may be electrically connected to the light emitting elements 14 and the light emitting elements 16 and be used for controlling switching and light emitting brightness of the light emitting elements 14 and the light emitting elements 16, so that the display device 1a may display images. The circuit layer 28 may include a plurality of active elements for driving corresponding light emitting elements. For example, the active elements may include a plurality of driving elements 32 and a plurality of switching elements (not shown), wherein the driving element 32 may be used to drive the corresponding light emitting element 14 or the corresponding light emitting element 16 to generate light, and the switching element may be used to control switching of the corresponding driving element 32, but not limited thereto. The active element may include, for example, a thin film transistor or other suitable transistors. In some embodiments, the circuit layer 28 may include signal lines (not shown) and other suitable elements in addition to the active elements. The signal lines may include, for example, data lines, scan lines, common lines, power lines or other required signal lines.

In the embodiments shown in FIG. 4 and FIG. 5, the driving element 32 and the switching element may be, for example, top-gate type thin film transistors, and in this case, the circuit layer 28 may include a semiconductor layer 34, an insulating layer IN1, a metal layer M1, an insulating layer IN2, a metal layer M2, an insulating layer IN3 and a planarization layer 36. The semiconductor layer 34 is disposed on the substrate 26 and may include a plurality of channels CH, a plurality of source (drain) regions SD1 and a plurality of drain (source) regions SD2 of the driving elements 32. The source (drain) region SD1 and the drain (source) region SD2 may be disposed on both sides of the channel CH and may include, for example, P-type doped or N-type doped semiconductors. The insulating layer IN1 may be disposed on the semiconductor layer 34 and serve as a gate insulating layer of the driving elements 32. The metal layer M1 may be disposed on the insulating layer IN1 and include a plurality of gates G of the driving elements 32 respectively disposed on the corresponding channels CH. The insulating layer IN2 may be disposed on the metal layer M1, and the insulating layer IN1 and the insulating layer IN2 may have a plurality of through holes. The metal layer M2 may be disposed on the insulating layer IN2, and includes a plurality of electrodes E1 and a plurality of electrodes E2, and the electrodes E1 and the electrodes E2 may be respectively electrically connected to the corresponding source (drain) regions SD1 and the corresponding drain (source) regions SD2 through the through holes of the insulating layer IN2 and the insulating layer IN1. The insulating layer IN3 may be disposed on the metal layer M2 and may have a plurality of through holes. The metal layer M3 may be disposed on the insulating layer IN3 and may include a plurality of electrodes E3 respectively electrically connected to the corresponding drain (source) regions SD2 through the through holes of the insulating layer IN3. The planarization layer 36 may be disposed on the metal layer M3 and may have a plurality of through holes. The light emitting elements 14 and the light emitting elements 16 may be respectively electrically connected to the corresponding driving elements 32 through the through holes of the planarization layer 30.

The semiconductor layer 34 may include, for example, amorphous silicon, low-temperature polysilicon (LTPS), metal-oxide semiconductor, a combination of low-temperature polysilicon and oxide semiconductor, or other suitable semiconductor materials. The insulating layer IN1, the insulating layer IN2, the insulating layer IN3 and the planarization layer 36 may include insulating materials, and for example, the insulating materials may include inorganic insulating materials or organic insulating materials. The inorganic insulating material may include, for example, silicon oxide, silicon nitride, silicon oxynitride, or other suitable inorganic materials. In some embodiments, the insulating layer IN2 may include a single-layer or multilayer structure. For example, when the insulating layer IN2 includes the multilayer structure, the multilayer structure may include a stack of silicon oxide and silicon nitride, but not limited thereto. The metal layer M1, the metal layer M2 and the metal layer M3 may respectively include, for example, aluminum, molybdenum nitride, copper, titanium, other suitable materials, or a combination of at least two thereof, but not limited thereto.

The structure of the circuit layer 28 in the present disclosure is not limited to the mentioned above, and the stacking structure and/or the numbers of the insulating layers, the metal layers or other layers in the circuit layer 28 may be adjusted according to requirements, and for example, may be adjusted according to the type of the driving elements 32 and the switching elements or the type of pixel circuit. In some embodiments, the driving elements 32 and the switching elements may be, for example, bottom-gate thin film transistors, or may be changed to double-gate transistors or other suitable transistors as required.

As shown in FIG. 4 and FIG. 5, the display panel 12 may further include an insulating layer IN4 disposed on the circuit layer 28, wherein the insulating layer IN4 may include a plurality of openings OP2, and the light emitting units 14 and the light emitting units 16 may be respectively disposed corresponding to the openings OP2. The insulating layer IN4 may be, for example, a pixel defining layer, so that in the top view direction TD, a region of the opening OP2 may be used for defining a pixel or sub-pixel of the display device 1a, but not limited thereto. The insulating layer IN4 may include, for example, a light shielding material, wherein the light shielding material may include, for example, an organic material or other suitable materials, or the light shielding material may be, for example, a black material, but not limited thereto.

In the embodiment of FIG. 4 and FIG. 5, the light emitting elements 14 and the light emitting elements 16 include organic light emitting diodes as an example. In such situation, each of the light emitting elements 14 and the light emitting elements 16 may include an electrode E4, a light emitting layer and an electrode E5. The electrodes E4 may be disposed on the planarization layer 36 and spaced apart from each other. The insulating layer IN4 may be disposed on the electrodes E4 and the planarization layer 36, and each electrode E4 may be exposed by the corresponding opening OP2. Also, each light emitting layer 38 may be disposed in the corresponding opening OP2 of the insulating layer IN4, and each of the electrodes E5 may be disposed on the corresponding light emitting layer 38 and extend to the insulating layer IN4. The electrode E4 and the electrode E5 may be, for example, an anode and a cathode of the organic light emitting diode, respectively, but not limited thereto. The electrode E4 and the electrode E5 may be interchanged with each other. In the embodiment of FIG. 4 and FIG. 5, the electrodes E5 of the light emitting elements 14 and the light emitting elements 16 may be formed of the same conductive layer CL, but not limited thereto. The conductive layer CL may, for example, include a transparent conductive material or other suitable material to allow light generated by the light emitting layers 38 to pass through. It should be noted that a region of each of the light emitting elements 14 and the light emitting elements 16 may for example be defined as a region where the electrode E4, the light emitting layer 38 and the electrode E5 are overlapped with each other in the top view direction TD, but not limited thereto. The light emitting elements 14 and the light emitting elements 16 of the present disclosure are not limited thereto. In some embodiments, the light emitting elements 14 and the light emitting elements 16 may for example include light emitting diodes, wherein the light emitting diodes may be, for example, light emitting diode chips or light emitting diode package structures. In this case, the regions of the light emitting elements 14 and the light emitting elements 16 may be defined as the regions of the light emitting diodes.

As shown in FIG. 4 and FIG. 5, the display panel 12 may further include an encapsulation layer 40 disposed on the light emitting elements 14, the light emitting elements 16 and the insulating layer IN4. The lens layer 24 may be disposed on the encapsulation layer 40, but not limited thereto. The encapsulation layer 40 may be used for protecting the light emitting elements 14 and the light emitting elements 16. For example, the encapsulation layer 40 may include acrylic-based material, siloxane-based material, epoxy resin, polyimide (PI) or other materials suitable package material. In addition, the encapsulation layer 40 may be a structure of inorganic layers and organic layers alternately stacked, such as a three-layer stack structure of inorganic layer-organic layer-inorganic layer or a five-layer stack structure.

As shown in FIG. 5, the circuit layer 28 may have a plurality of openings OP3 corresponding to the openings OP1 of the light shielding layer 30 respectively, and the insulating layer IN4 may further have a plurality of openings OP4 corresponding to the openings OP3 respectively. Although FIG. 5 shows one opening OP3 and one opening OP4, the present disclosure is not limited thereto. In the embodiment of FIG. 5, the display panel 12 may further include a filling layer 42 disposed in the opening OP3 and the opening OP4. In some embodiments, a height of the filling layer 42 may be adjusted according to requirements, and for example, the filling layer 42 may be provided in the opening OP3 but not in the opening OP4. The filling layer 42 may, for example, include the same or similar materials or combinations as the encapsulation layer 40, but not limited thereto. A surface of the filling layer 42 may, for example, be flat or uneven. It should be noted that, since the opening OP3 has a certain depth in the top view direction TD, disposing the filling layer 42 at least in the opening OP3 may for example help reduce or avoid the encapsulation layer 40 being disposed in an excessively deep hole.

In some embodiments, as shown in FIG. 4 and FIG. 5, the display panel 12 may optionally include a buffer layer 44 disposed between the substrate 26 and the circuit layer 28. The buffer layer 44 may for example be used for blocking moisture, oxygen or ions from entering the display panel 12. The buffer layer 44 may include a single-layer structure or a multilayer structure. The material of the buffer layer 44 may include, for example, silicon nitride, silicon oxide, silicon oxynitride, aluminum oxide, resin, other suitable materials, or a combination of at least two thereof. In the embodiment of FIG. 5, the buffer layer 44 may have a plurality of openings OP5 corresponding to the openings OP1. For example, in the horizontal direction (e.g., the horizontal direction HD1 or the horizontal direction HD2 shown in FIG. 3), a width of the opening OP5 may be less than that of the opening OP1. In some embodiments, the display panel 12 may not include the buffer layer 44, but not limited thereto.

As shown in FIG. 4 and FIG. 5, the display device 1a may optionally include a color filter layer 46 disposed on the lens layer 24, wherein the color filter layer 46 includes a plurality of color filter units overlapped with the light emitting elements 14 and the light emitting elements 16 respectively. For example, the color filter units may include a plurality of first color filter units 46a, a plurality of second color filter units 46b, and a plurality of third color filter units (the third color filter unit 46c shown in FIG. 6), and the first color filter units 46a, the second color filter units 46b and the third color filter units 46c may have different colors so as to have different transmittances with respect to light in different wavelength ranges. The first color filter unit 46a, the second color filter unit 46b, and the third color filter unit 46c may be, for example, a blue filter, a red filter and a green filter, respectively, but not limited thereto. In the embodiment of FIG. 4 and FIG. 5, the first color filter units 46a may be overlapped with the light emitting elements 14a and the light emitting elements 16a, respectively; the second color filter units 46b may be overlapped with the light emitting elements 14b and the light emitting elements 16b, respectively; and the third color filter units 46c may be overlapped with the light emitting elements 14c and the light emitting elements 16c as shown in FIG. 1, respectively, but not limited thereto. The first color filter units 46a, the second color filter units 46b and the third color filter units 46c may for example have anti-reflection effects to reduce interference of ambient light on the image displayed by the display device 1a. In some embodiments, the color filter layer 46 may be replaced with other types of anti-reflection film, such as linear polarizer.

As shown in FIG. 4 and FIG. 5, the color filter layer 46 may further include a light shielding layer 46d disposed between the color filter units. Specifically, the light shielding layer 46d may have a plurality of first openings OP6, a plurality of second openings OP7 and a plurality of third openings (e.g., a third opening OP9 shown in FIG. 6), wherein the first color filter units 46a may be disposed in the first openings OP6 respectively, the second color filter units 46b may be disposed in the second openings OP7 respectively, and the third color filter units may be disposed in the third openings respectively. It should be noted that the light shielding layer 46d may further have a plurality of fourth openings OP8 corresponding to the transmission areas TR1 respectively, so that the light passing through the transmission areas TR1 of the display panel 12 may pass through the fourth openings OP8. When viewed along the top view direction TD, a size of the fourth opening OP8 may be, for example, greater than a size of the opening OP1, so as to increase the amount of incident light entering the transmission area TR1. In some embodiments, the color filter layer 46 may not have a color filter unit or a color filter in the fourth opening OP8. In some embodiments, the display device 1a may further include an encapsulation layer 54 disposed on the color filter layer 46.

In the embodiment of FIG. 4 and FIG. 5, the display device 1a may include another planarization layer 48 disposed on the lens layer 24 and the display panel 40 and between the lens layer 24 and the color filter layer 46. For example, the planarization layer 48 may have a flat upper surface to facilitate the formation of a layer (e.g., the color filter layer 46) on the lens layer 24.

In some embodiments, the display device 1a may optionally further include a touch device layer 50 and an insulating layer 52, wherein the insulating layer 52 may be disposed on the planarization layer 48, and the touch device layer 50 may be disposed between the planarization layer 48 and the insulating layer 52. The touch device layer 50 may be used for detecting a position where a finger touches or is close to the display surface 1S of the display device 1a. In the embodiment of FIG. 5, the touch device layer 50 may include, for example, a metal mesh overlapped with the light shielding layer 46d in the top view direction TD, so as to reduce visibility of the touch device layer 50. The number of layers and/or a pattern in the top view direction TD of the touch device layer 50 may be designed according to requirements. In some embodiments, the touch device layer 50 is not limited to the metal mesh and may be replaced with other types of touch devices. The insulating layer 52 may include, for example, silicon oxide, silicon nitride, or other suitable insulating materials.

The display device is not limited to the above-mentioned embodiments and may have other embodiments. In order to simplify the description, other embodiments hereinafter will use the same reference numerals to denote the same elements as the above-mentioned embodiments. In order to easily compare the differences between the above-mentioned embodiment and other embodiments, differences between these embodiments will be described below, and same parts will not be detailed again.

Figure 6:
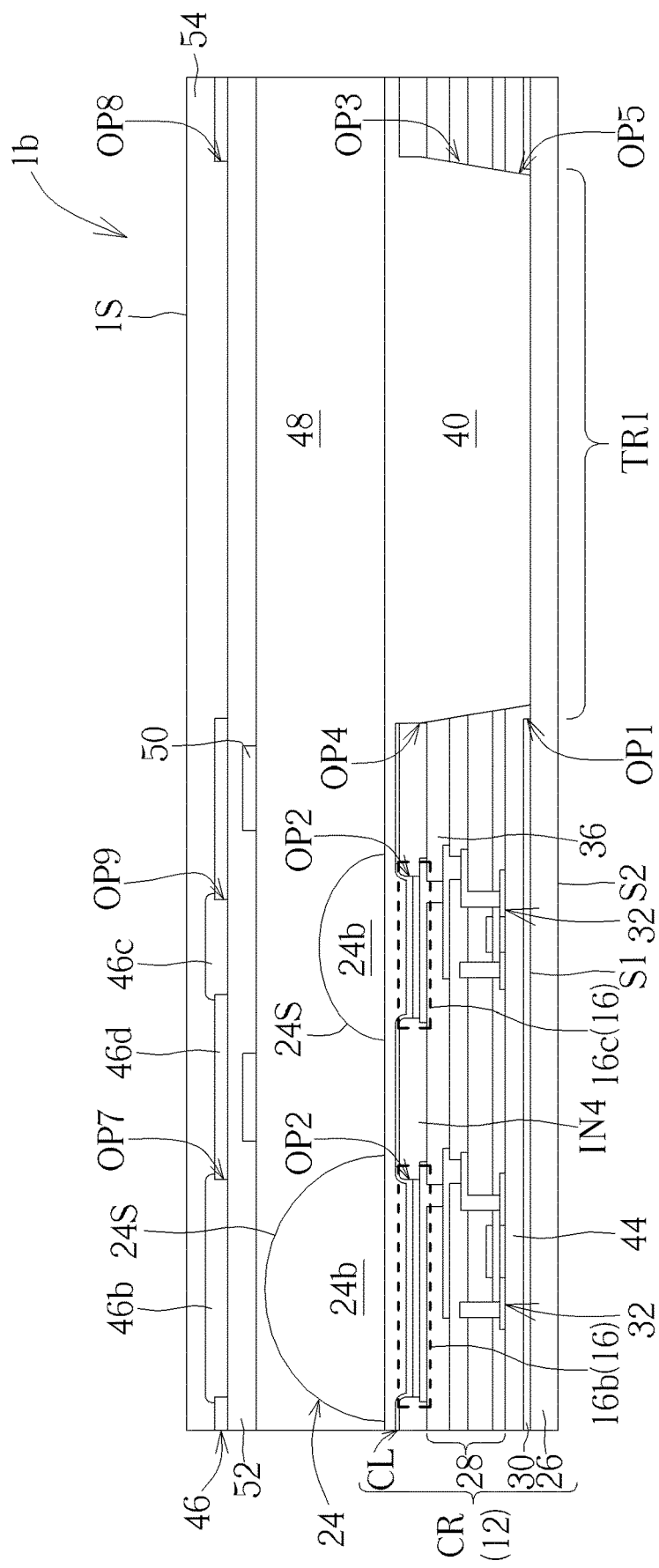
FIG. 6 schematically illustrates a sectional view of a portion of a display device corresponding to a camera region according to another embodiment of the present disclosure.

FIG. 6 schematically illustrates a sectional view of a portion of a display device corresponding to a camera region according to another embodiment of the present disclosure. As shown in FIG. 6, in the display device 1b provided in this embodiment, the lenses 24b corresponding to different light emitting elements in the camera region CR may have different widths. For example, when the light emitting area of the light emitting element 16c may be less than that of the light emitting element 16b, the width of the lens 24b disposed on the light emitting element 16c may be less than the width of the lens 24b disposed on the light emitting element 16b. In this case, the upper surfaces 24S of the lenses 24b corresponding to different light emitting elements may for example have the same radius of curvature or different radii of curvature. It is noted that the structure of the lenses 24b with different widths may reduce the contact of the lenses 24b with each other when the lens layer 24 is formed, or help reduce the difficulty of processes. In some embodiments, the width of the lens 24b disposed on the light emitting element 16a shown in FIG. 5 may be greater than the width of the lens 24b disposed on the light emitting element 16c.

In the embodiment of FIG. 6, the third opening OP9 overlapped with the light emitting element 16c may be less than the second opening OP7 overlapped with the light emitting element 16b, so that in the horizontal direction (e.g., the horizontal direction HD1 or the horizontal direction HD2 shown in FIG. 3), the width of the third color filter unit 46c disposed in the third opening OP9 may be, for example, less than the width of the second color filter unit 46b and/or the width of the first color filter unit (the first color filter unit 46a shown in FIG. 5). In some embodiments, the lenses 24a corresponding to different light emitting elements in the normal region NR may have different widths, and for example, the structure of the lenses 24a in the normal region NR may be the same as the structure of the lenses 24b in the camera region CR.

In some embodiments, the display device 1b may not have the filling layer 42 shown in FIG. 5, and in this case, the encapsulation layer 40 may be further disposed in the opening OP3, or disposed in both the opening OP3 and the opening OP5, but not limited thereto. In some embodiments, other parts of the display device 1b shown in FIG. 6 may, for example, adopt one of the display devices of other embodiments mentioned herein or a combination of at least two display devices of other embodiments and are not described redundantly.

Figure 8:
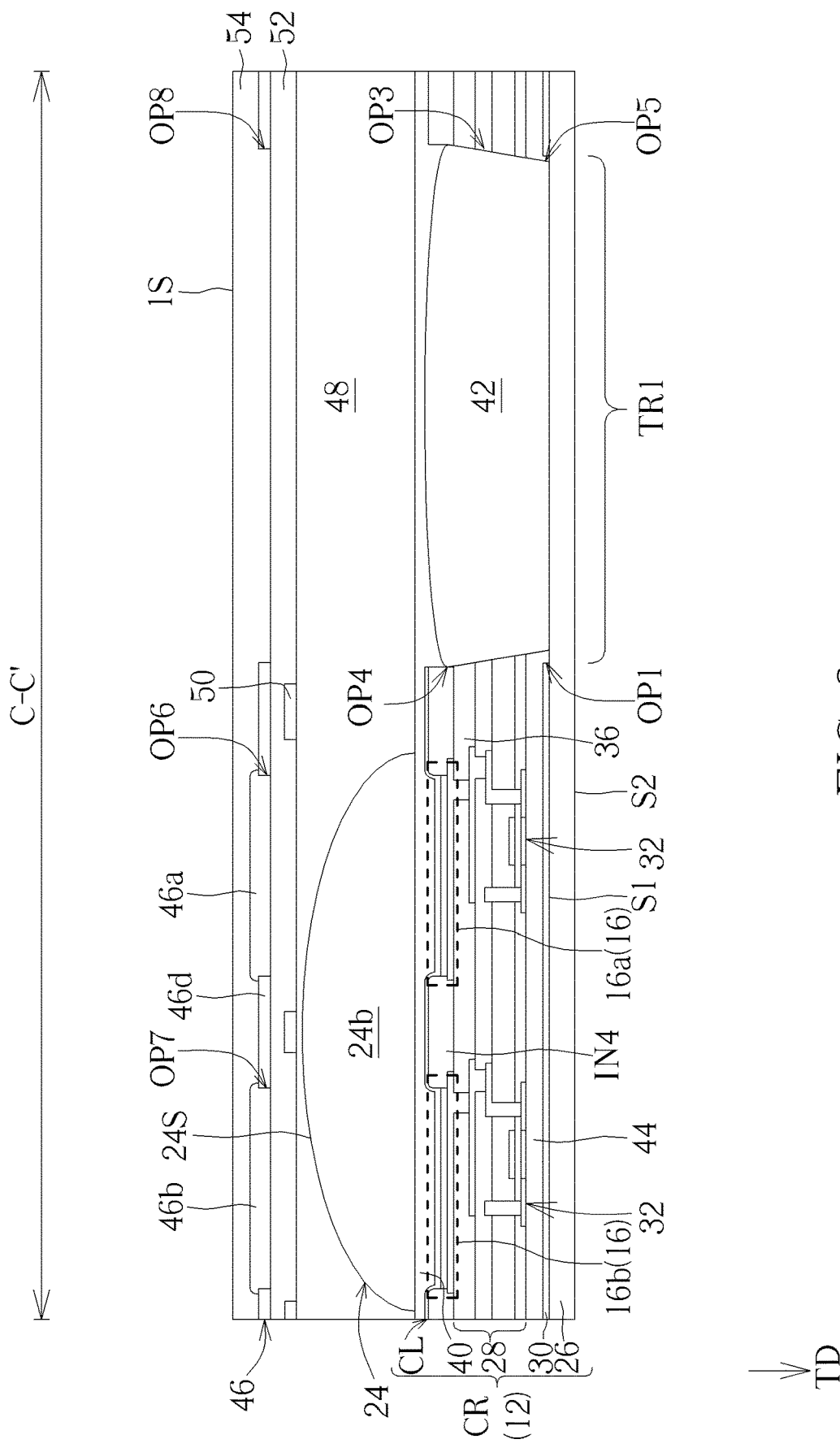
FIG. 8 schematically illustrates a sectional view taken along a sectional line C-C' of FIG. 7.

FIG. 7 schematically illustrates a top view of a portion of the display device corresponding to a normal region and a camera region according to another embodiment of the present disclosure, and FIG. 8 schematically illustrates a sectional view taken along a sectional line C-C' of FIG. 7. As shown in FIG. 7 and FIG. 8, in the display device 1c provided in this embodiment, the lens 24a in the normal region NR and the lens 24b in the camera region CR may have different widths. For example, the width of the lens 24a may be less than the width of the lens 24b. In the embodiment of FIG. 7 and FIG. 8, one of the lenses 24b may be overlapped with a plurality of the light emitting elements 16 of the camera region CR. For example, one of the lenses 24b may be overlapped with one light emitting element 16a, one light emitting element 16b, and two light emitting elements 16c, or be overlapped with one pixel, but not limited thereto.

In some embodiments, as shown in FIG. 7, a top view shape of the opening OP1 of the light shielding layer 30 may not be limited to circle shown in FIG. 3, but may be other shapes, such as a rectangle or other suitable shapes. In some embodiments, the light shielding layer 30 may be disposed in the camera region CR and a part of the normal region NR adjacent to the camera region CR, but not limited thereto.

In some embodiments, other parts of the display device 1c shown in FIG. 7 and FIG. 8 may for example adopt one of the display devices of other embodiments or a combination of at least two display devices of other embodiments mentioned herein and are not described redundantly.

Figure 10:
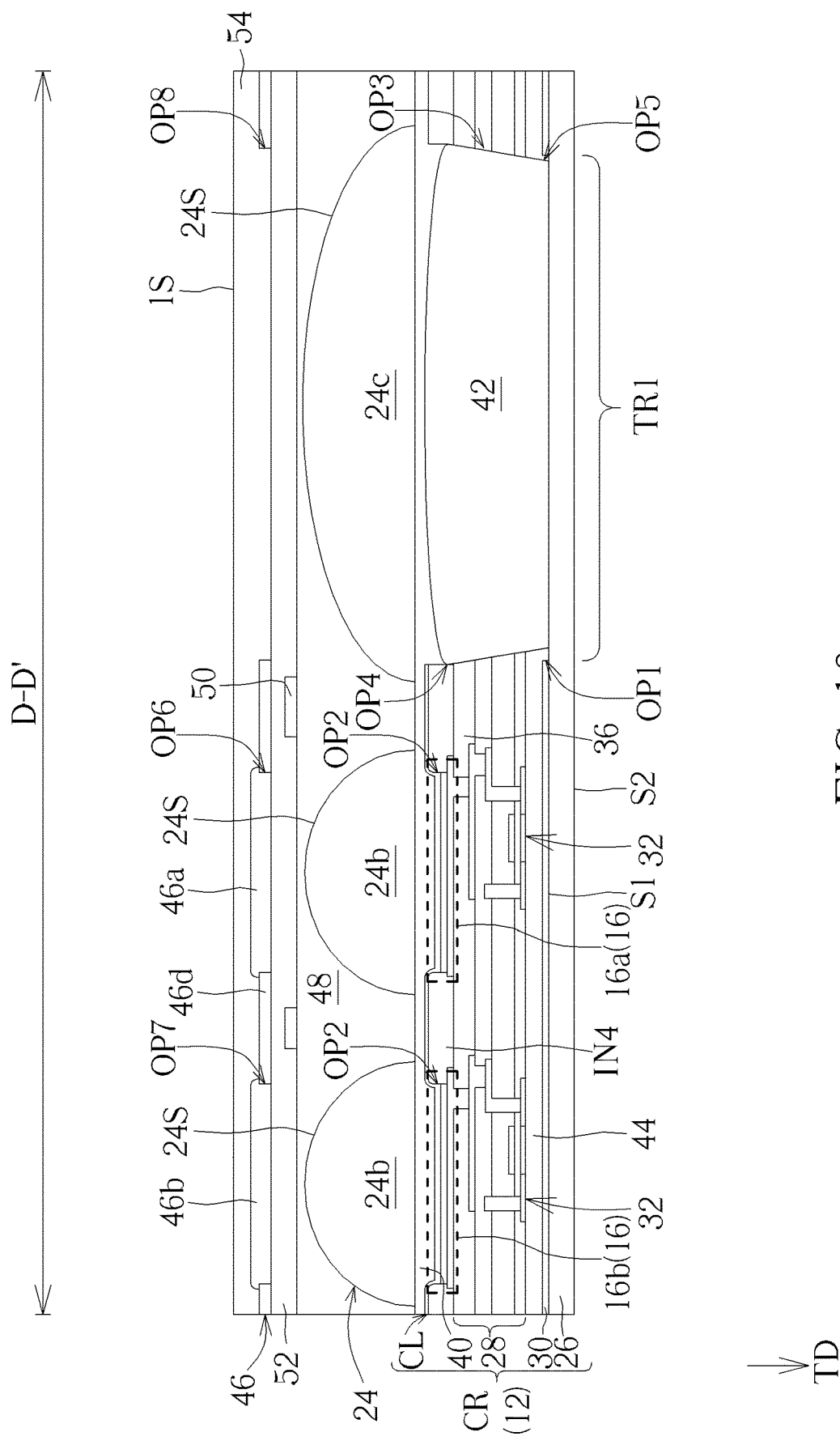
FIG. 10 schematically illustrates a sectional view taken along a sectional line D-D' of FIG. 9.

FIG. 9 schematically illustrates a top view of a portion of a display device corresponding to the normal region and the camera region according to another embodiment of the present disclosure, and FIG. 10 schematically illustrates a sectional view taken along a sectional line D-D' of FIG. 9. As shown in FIG. 9 and FIG. 10, in the display device 1d provided in this embodiment, the lens layer 24 further includes a plurality of lenses 24c respectively overlapped with the transmission areas TR1. For example, a top view size of the lens 24c is substantially the same as a top view size of the opening OP1, but not limited thereto. It should be noted that overlapping arrangement of the lenses 24c and the transmission area TR1 may help light be focused on the camera module (the camera module as shown in FIG. 2) located under the display panel 12 to improve quality of the image detected by the camera module or increase signal-to-noise ratio of the camera module. In some embodiments, the upper surface 24S of the lens 24b and the upper surface 24S of the lens 24c may, for example, have the same radius of curvature or different radii of curvature. In some embodiments, the lens 24c may have a refractive index the same as or different from the refractive index of the lens 24a and/or the lens 24b.

In some embodiments, the light shielding layer 30 may not be disposed in the normal region NR, but may be disposed in the camera region CR, but not limited thereto. In some embodiments, other parts of the display device 1d shown in FIG. 9 and FIG. 10 may, for example, adopt one of the display devices of other embodiments herein or a combination of at least two display devices of other embodiments and are not described redundantly. In some embodiments, the lens 24b shown in FIG. 9 and FIG. 10 may for example adopt the lens 24b shown in FIG. 7 and be overlapped with a plurality of the light emitting elements 16.

Figure 11:
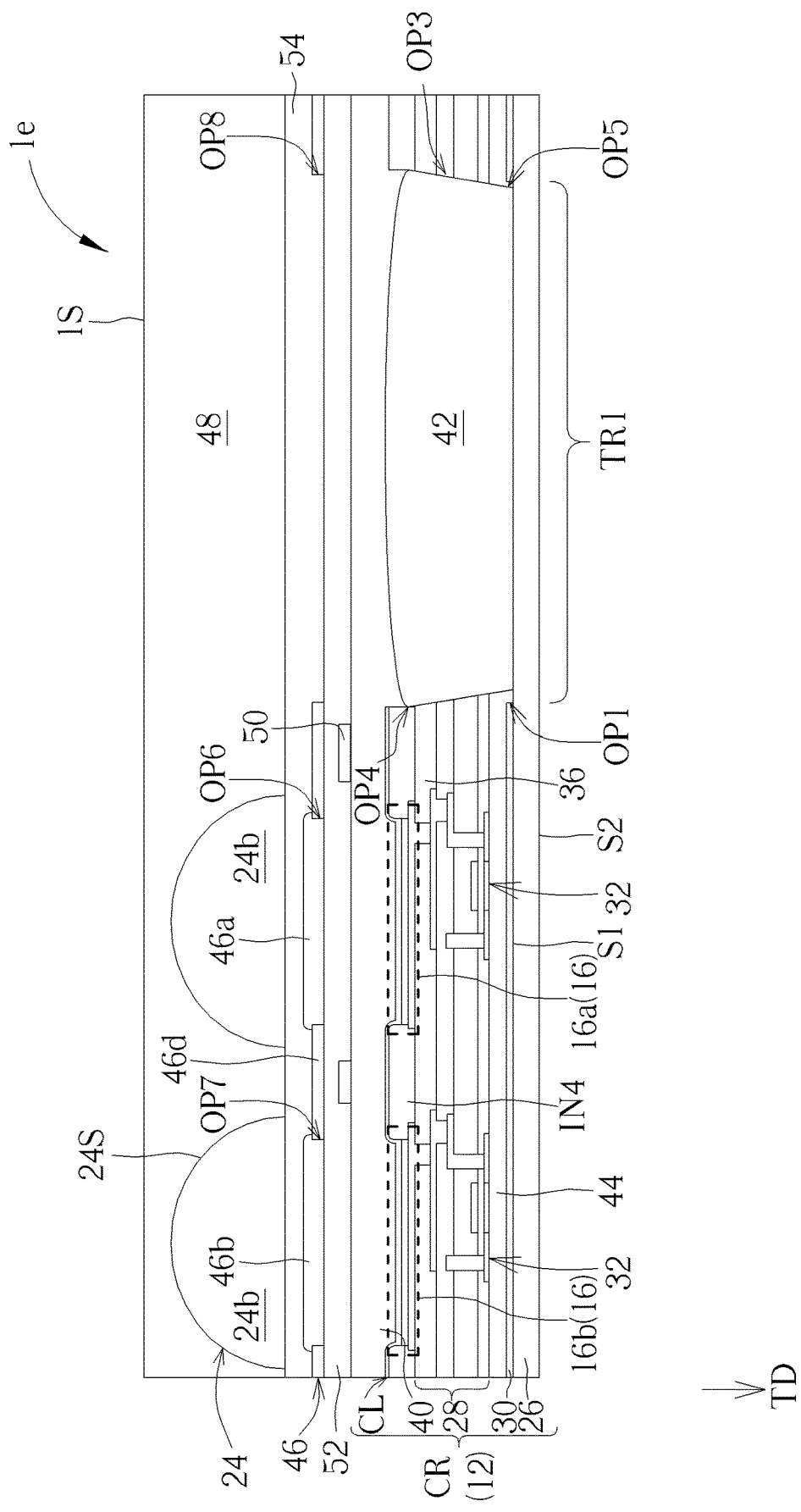
FIG. 11 schematically illustrates a sectional view of a portion of a display device corresponding to a camera region according to another embodiment of the present disclosure.

FIG. 11 schematically illustrates a sectional view of a portion of a display device corresponding to a camera region according to another embodiment of the present disclosure. As shown in FIG. 11, the display device 1e of this embodiment differs from the display device 1a shown in FIG. 5 in that the lens layer 24 may be disposed on the color filter layer 46. In other words, the touch device layer 50 and the insulating layer 52 may be directly disposed on the encapsulation layer 40, but not limited thereto. In some embodiments, other layers may exist between the touch device layer 50 and the encapsulation layer 40. In addition, in this embodiment, the planarization layer 48 may be optionally disposed on the lens layer 24 to protect the lens layer 24, but not limited thereto. In some embodiments, other parts of the display device 1e shown in FIG. 11 may, for example, use the display devices of other embodiments mentioned herein or a combination of at least two display devices of other embodiments and are not described redundantly.

Figure 12:
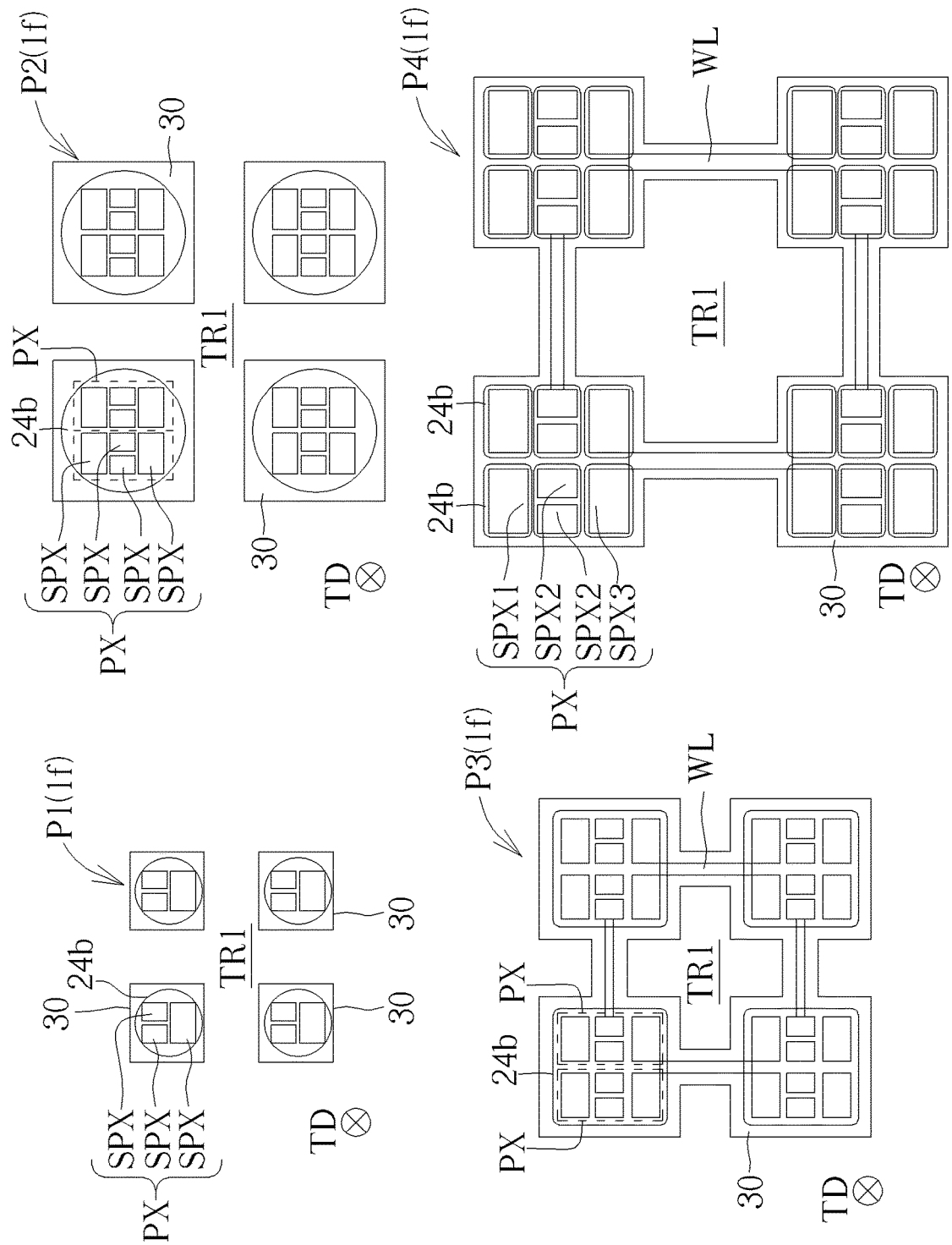
FIG. 12 schematically illustrates a top view of corresponding relationships between the lenses and the sub-pixels in the camera region according to some embodiments of the present disclosure.

FIG. 12 schematically illustrates a top view of corresponding relationships between the lenses and the sub-pixels in the camera region according to some embodiments of the present disclosure. As shown in an upper left part P1, an upper right part P2 and a lower left part P3 of FIG. 12, one of the lenses 24b of the display device if may be overlapped with a plurality of sub-pixels SPX in the top view direction TD, wherein the sub-pixels SPX may be, for example, the light emitting elements 16 as shown in FIG. 1, but not limited thereto. In the upper left part P1 of FIG. 12, one of the pixels PX may include a plurality of the sub-pixels SPX and be arranged in the same block, and one of the lenses 24b may be overlapped with one of the pixels PX in the same block. In the upper right part P2 and the lower left part P3 of FIG. 12, a plurality of the pixels PX may be arranged in one block, and one of the lenses 24b may be overlapped with a plurality of the pixels PX arranged in the same block. In the upper left part P1 and the upper right part P2 of FIG. 12, a top view shape of the lens 24b may be different from a top view shape of the block. For example, the top view shape of the lens 24b may be circular, and the top view shape of the block may be rectangular, but not limited thereto. It should be noted that, the transmission area TR1 may be disposed between different blocks in FIG. 12.

In the lower left part P3 and a lower right part P4 of FIG. 12, the top view shape of the lens 24b of the display device if may be designed along an outline of one of the blocks or one of the sub-pixels, for example, so as to be the same as or similar to the top view shape of the corresponding block or sub-pixel. For example, as shown in the lower left part P3 of FIG. 12, when a plurality of the sub-pixels SPX are arranged in a rectangular block, the top view shape of the lens 24b may be, for example, a rectangle. The top view shape of the lens 24b may have rounded corners, but not limited thereto. As shown in the lower right portion P4 of FIG. 12, a plurality of the pixels PX may be arranged in a block, and the block may be overlapped with a plurality of the lenses 24b. For example, one of the lenses 24b may be overlapped with at least one of the sub-pixels SPX of the same color. In the lower right part P4 of FIG. 12, one of the pixels PX may include one sub-pixel SPX1, two sub-pixels SPX2 and one sub-pixel SPX3, in which the sub-pixel SPX1, the sub-pixel SPX2 and the sub-pixel SPX3 are respectively used for generating light of different colors, and a size of the sub-pixel SPX1 and a size of the sub-pixel SPX3 may be greater than a size of the sub-pixel SPX2. One of the lenses 24b may be overlapped with one of the sub-pixels SPX1 or one of the sub-pixels SPX3, and another one of the lenses 24b may be overlapped with two of the sub-pixels SPX2 for generating the same color, so that different lenses 24b may have substantially the same top view size, but not limited thereto. In this case, the top view shape of the lens 24b may be close to or the same as the top view shape of the sub-pixel overlapped with the lens 24b.

It should be noted that, in the lower left part P3 and the lower right part P4 of FIG. 12, the display device if may further include a wire group WL electrically connected to the sub-pixels in the same block. In FIG. 12, the wire group WL may represent a plurality of wires, which are respectively electrically connected to different sub-pixels in the same block. By disposing the wire group WL at an edge of the transmission area TR1, and/or by reducing a width of the wire group WL to be less than the width of the block, an area of the transmission area TR1 may be increased. The method of reducing the wire group WL may be, for example, to reduce distances between the wires and/or widths of the wires of the same wire group WL, and/or to form the wires by different conductive layers and provide an insulating layer between any two of the conductive layers, so that the wires may be overlapped with each other, but not limited thereto.

In some embodiments, at least one of the upper left part P1, the upper right part P2, the lower left part P3 and the lower right part P4 of the display device if shown in FIG. 12 may be adapted to the display devices of other embodiments. Other parts of the display device if shown in FIG. 12 may, for example, adopt one of the display devices of other embodiments mentioned herein or a combination of the display devices of at least two other embodiments, and thus their detailed descriptions are omitted.

Figure 13:
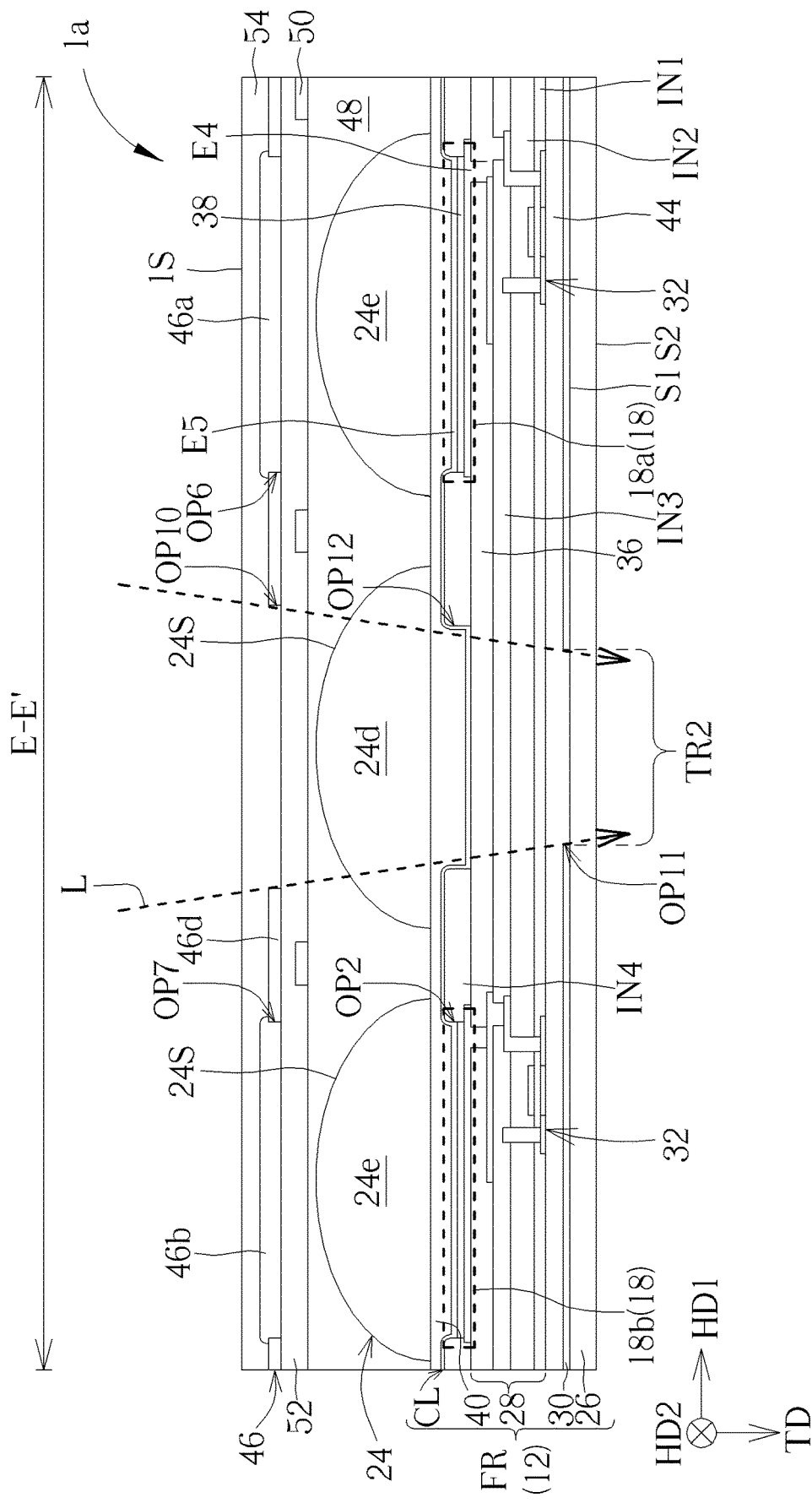
FIG. 13 schematically illustrates a sectional view of a portion of a display device corresponding to a fingerprint sensing region according to an embodiment of the present disclosure.

The structure of a portion of the display device corresponding to the fingerprint sensing region is further detailed in the following description. Please refer to FIG. 13 together with FIG. 1. FIG. 13 schematically illustrates a sectional view of a portion of a display device corresponding to a fingerprint sensing region according to an embodiment of the present disclosure. FIG. 13 may be, for example, a schematic sectional view taken along a sectional line E-E' corresponding to the fingerprint sensing region FR in FIG. 1. As shown in FIG. 13, in the display device 1a provided in this embodiment, the display panel 12 may have the fingerprint sensing region FR, and the fingerprint sensing region FR may include a transmission area TR2 for allowing light to pass through. FIG. 13 takes the transmission area TR2 as an example, but the present disclosure is not limited thereto. Specifically, the fingerprint sensing region FR may include a part of the substrate 26, a part of the circuit layer 28, a part of the insulating layer IN4, and a part of the light shielding layer 30. The part of the light shielding layer 30 may have a plurality of openings OP11, and the openings OP11 may respectively define the corresponding transmission areas TR2. The transmission area TR2 may not be overlapped with the light emitting elements 18 and wires of the circuit layer 28 in the top view direction TD. The part of the insulating layer IN4 may have a plurality of openings OP12 corresponding to the openings OP11 respectively. The light-shielding layer 46d of the color filter layer 46 may further include a plurality of openings OP10 respectively overlapped with the transmission areas TR2 and correspond to the openings OP11. Through the openings OP10, the openings OP12 and the openings OP11, ambient light L may be directed to the sensing units of the fingerprint sensing module (e.g., the sensing units 22a of the fingerprint sensing module 22 shown in FIG. 2). In some embodiments, a top view size of the opening OP10 may be greater than a top view size of the opening OP12, and a top view size of the opening OP12 may be greater than a top view size of the opening OP11, so as to improve light intensity detected by the fingerprint sensing module. In the embodiment of FIG. 13, the structure of the fingerprint sensing region FR outside the transmission areas TR2 may be, for example, similar to or the same as the structure of the normal region NR, and other parts of the color filter layer 46 corresponding to the fingerprint sensing region FR may be, for example, similar to or the same as a part of the color filter layer 46 corresponding to the normal region NR, so their detailed description will not be repeated.

As shown in FIG. 1 and FIG. 13, a density of the light emitting elements 18 in the fingerprint sensing region FR may be substantially the same as the density of the light emitting elements 14 in the normal region NR, so that the circuit layer 28 of the fingerprint sensing region FR may not have openings in the transmission areas TR2. In this case, the insulating layer IN1, the insulating layer IN2, the insulating layer IN3, the planarization layer 36, and the buffer layer 44 may include a transparent insulating material to allow light to pass through. For example, in the horizontal direction (e.g., the horizontal direction HD1), a width of the transmission area TR2 may be, for example, less than the width of the transmission area TR1 shown in FIG. 3.

In the embodiment of FIG. 13, the lens layer 24 may optionally include a plurality of lenses 24d overlapped with the transmission areas TR2. The overlapping arrangement of the lens 24d and the transmission area TR2 may help focus the ambient light L on the fingerprint sensing module located under the display panel 12, so as to improve accuracy of fingerprint detected by the fingerprint sensing module. In addition, the lens layer 24 further includes a plurality of lenses 24e overlapped with the light emitting elements 18. In the embodiment of FIG. 13, the lens 24e may be overlapped with the light emitting element 18, but not limited thereto. In some embodiments, the lenses 24e corresponding to the different light emitting elements of the fingerprint sensing region FR may adopt the structure of the lenses 24a of FIG. 4 or the structure of the lenses 24b of FIG. 5.

In some embodiments, a refractive index of the lens 24d may be the same as or different from a refractive index of the lens 24e. For example, the refractive index of the lens 24d may be less than the refractive index of the lens 24e, the refractive index of the lens (e.g., the lens 24a shown in FIG. 4) corresponding to the normal region NR, and/or the refractive index of the lens (e.g., the lens 24b shown in FIG. 5) corresponding to the camera region CR, so as to enhance the light intensity detected by the fingerprint sensing module. The refractive index of the lens 24d may for example range from 1.01 to 1.50, and the refractive index of the lens 24e may for example range from 1.51 to 2.1, but not limited thereto. The lens 24d and the lens 24e may include different materials or include the same materials with different composition combinations, such as acrylic-based materials, siloxane-based materials, epoxy resins, polyimide, or other suitable materials. In order to have different refractive indexes, the materials of the lens 24d and the lens 24e may be added with some inorganic particles or the composition combinations of the lens 24d and the lens 24e may be changed. In some embodiments, the lens 24d and/or the lens 24e may, for example, include nanoparticles for adjusting the refractive index. When the lens 24e and the lens 24d have the same refractive index, the refractive index of the lens 24d may be less than the refractive index of the lens 24a.

In some embodiments, the lenses 24e corresponding to the different light emitting elements of the fingerprint sensing region FR may adopt the structure of the lenses 24b in FIG. 6. In some embodiments, other parts of the display device 1a shown in FIG. 13 may, for example, use the display devices of other embodiments mentioned herein or a combination of at least two display devices of other embodiments and are not described redundantly.

Figure 14:
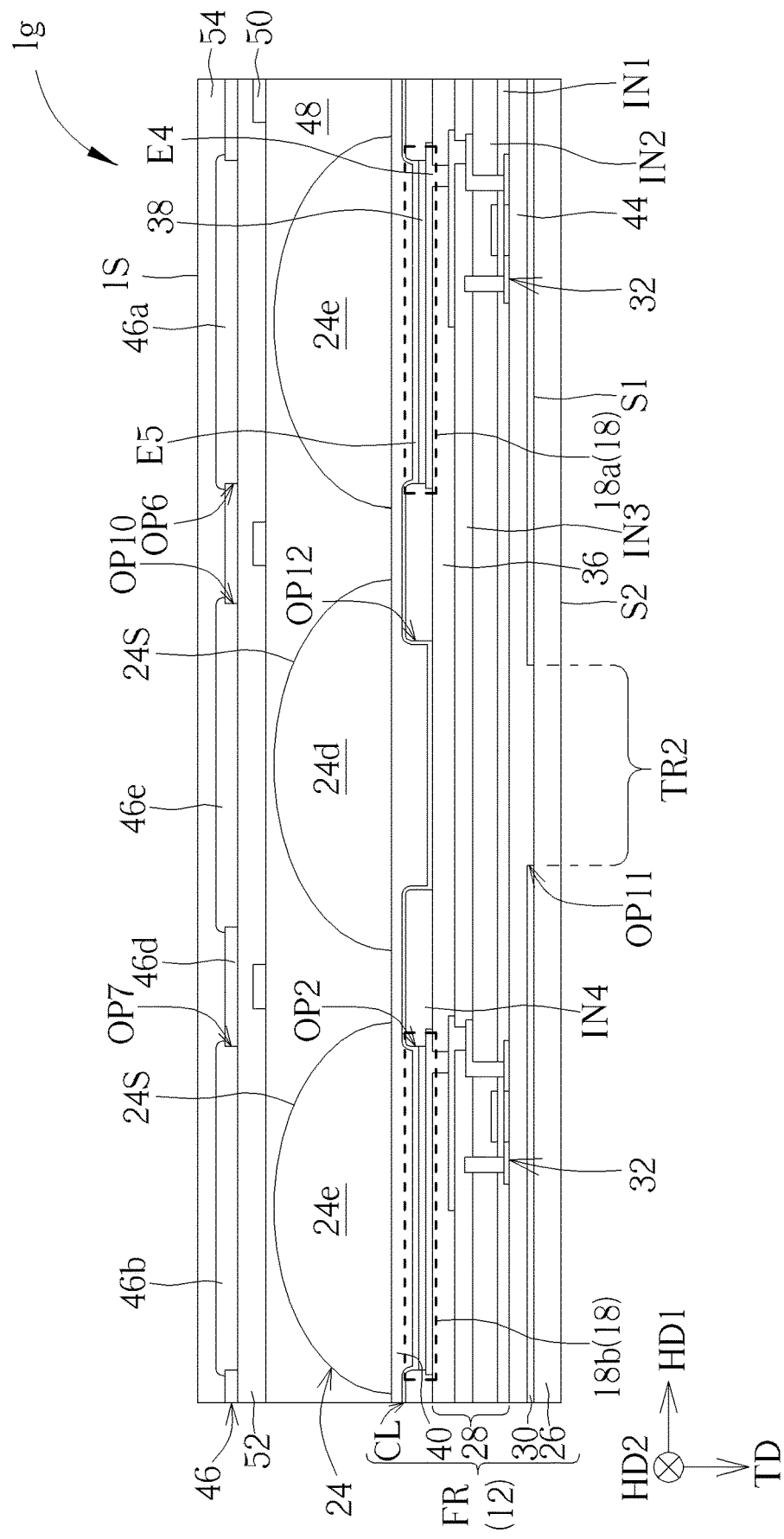
FIG. 14 schematically illustrates a sectional view of a portion of a display device corresponding to a fingerprint sensing region according to another embodiment of the present disclosure.

FIG. 14 schematically illustrates a sectional view of a portion of a display device corresponding to a fingerprint sensing region according to another embodiment of the present disclosure. As shown in FIG. 14, the display device 1g of this embodiment differs from one of the display devices 1a shown in FIG. 13 in that the color filter layer 46 may include a plurality of color filters 46e overlapped with the light transmission areas TR2. Specifically, the color filters 46e may be respectively disposed in the openings OP10 to allow the light corresponding to a wavelength range detected by the fingerprint sensing module to pass through, thereby improving the detection accuracy. When the fingerprint sensing module may detect green light, the color filter 46e may be, for example, a green filter. In some embodiments, other parts of the display device 1g shown in FIG. 14 may, for example, adopt one of the display devices of other embodiments mentioned herein or a combination of at least two display devices of other embodiments and are not described redundantly.

Figure 15:
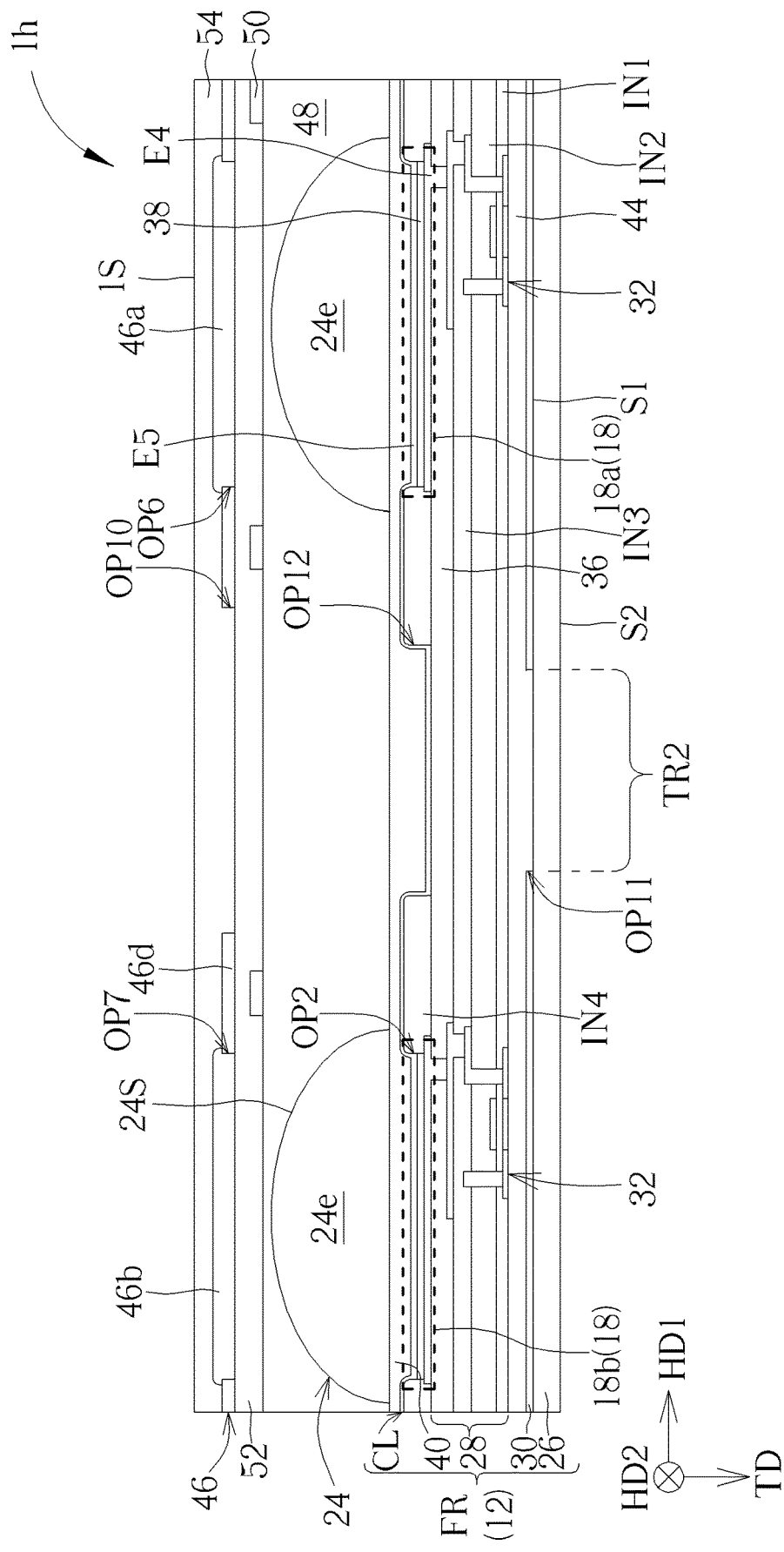
FIG. 15 schematically illustrates a sectional view of a portion of a display device corresponding to a fingerprint sensing region according to another embodiment of the present disclosure.

FIG. 15 schematically illustrates a sectional view of a portion of a display device corresponding to a fingerprint sensing region according to another embodiment of the present disclosure. As shown in FIG. 15, the display device 1h of this embodiment differs from one of the display devices 1a shown in FIG. 13 in that the lens layer 24 does not have the lenses 24d in the transmission area TR2, but not limited thereto. In some embodiments, the display device 1h of FIG. 15 may employ the color filter layer 46 of FIG. 14, but not limited thereto. In some embodiments, other parts of the display device 1h shown in FIG. 15 may, for example, employ one of the display devices of other embodiments mentioned herein or a combination of at least two display devices of other embodiments and are not described redundantly.

Figure 16:
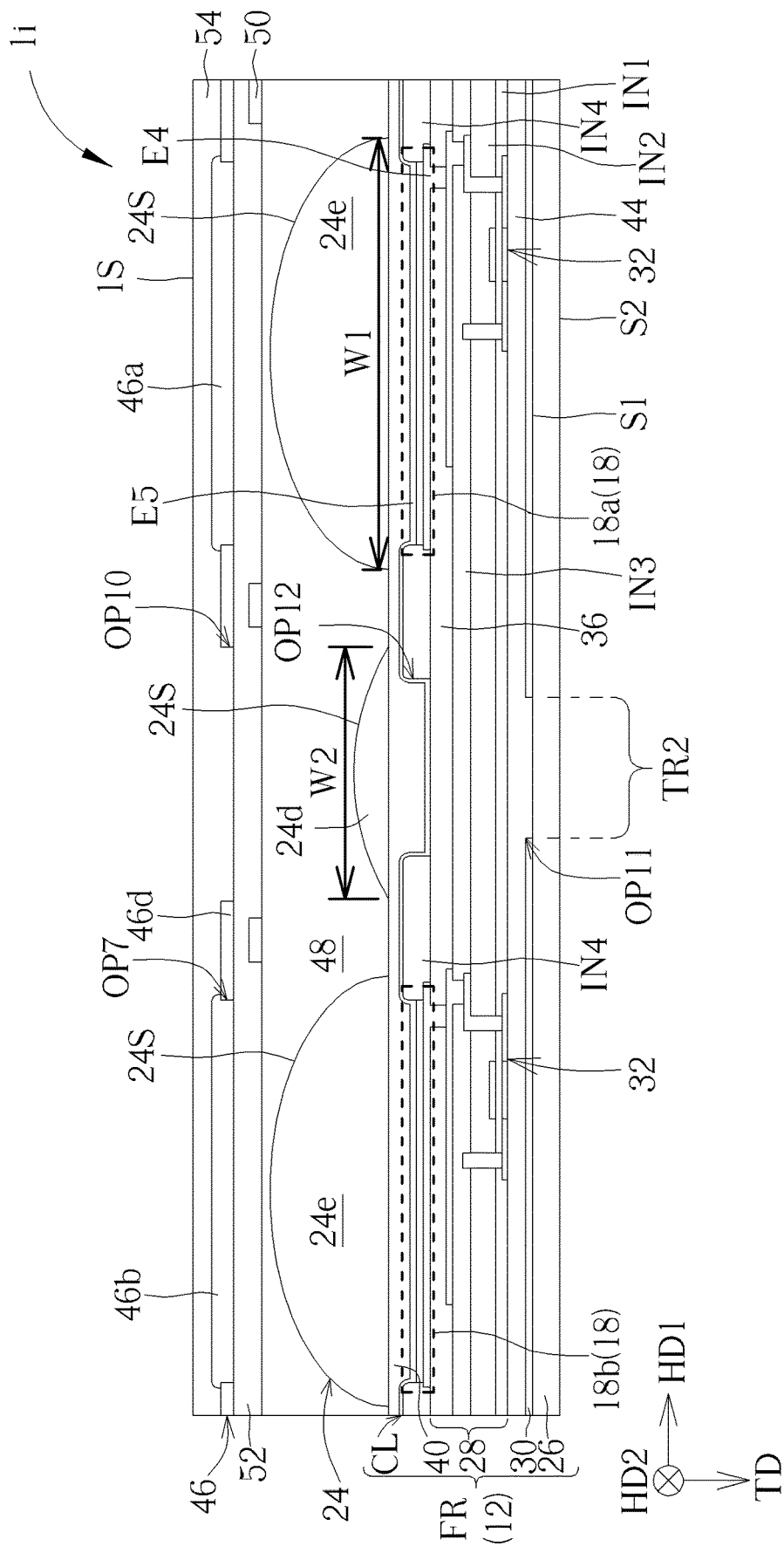
FIG. 16 schematically illustrates a sectional view of a portion of a display device corresponding to a fingerprint sensing region according to another embodiment of the present disclosure.

FIG. 16 schematically illustrates a sectional view of a portion of a display device corresponding to a fingerprint sensing region according to another embodiment of the present disclosure. As shown in FIG. 16, the display device 1i of this embodiment differs from one of the display devices 1a shown in FIG. 13 in that a width W2 of the lens 24d may be less than a width W1 of the lens 24e, the width of the lens (e.g., the lens 24a shown in FIG. 4) corresponding to the normal region NR and/or the width of the lens (e.g., the lens 24b shown in FIG. 5) corresponding to the camera region CR. In this case, the upper surface 24S of the lens 24d (and/or the lens 24a) and the upper surface 24S of the lens 24e may have the same radius of curvature or different radii of curvature. In some embodiments, the display device 1i of FIG. 16 may employ the color filter layer 46 of FIG. 14, but not limited thereto. In some embodiments, other parts of the display device 1i shown in FIG. 16 may, for example, employ one of the display devices of other embodiments mentioned herein or a combination of display devices of at least two other embodiments and are not described redundantly.

Figure 17:
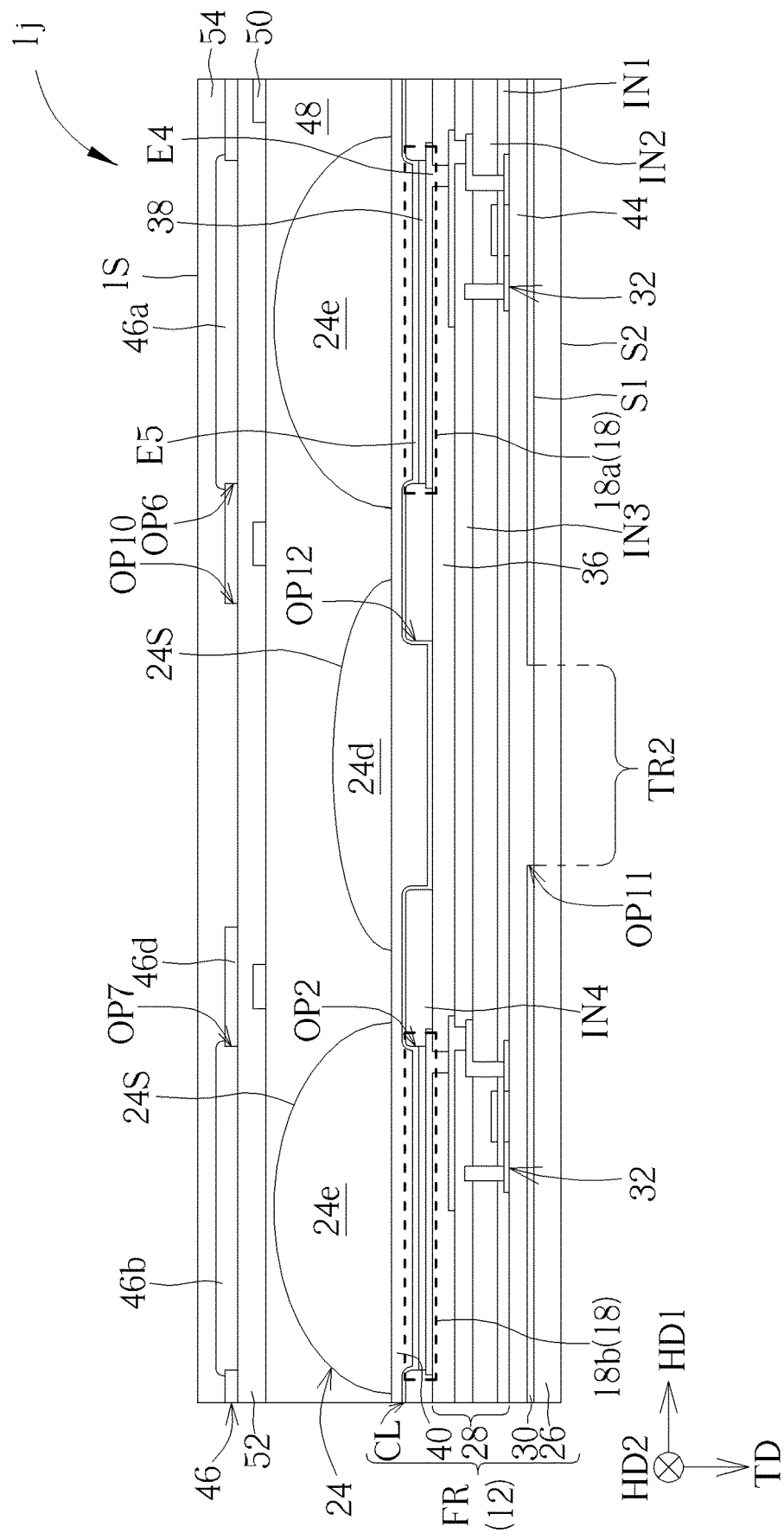
FIG. 17 schematically illustrates a sectional view of a portion of a display device corresponding to a fingerprint sensing region according to another embodiment of the present disclosure.

FIG. 17 schematically illustrates a sectional view of a portion of a display device corresponding to a fingerprint sensing region according to another embodiment of the present disclosure. As shown in FIG. 17, the display device 1j of this embodiment differs from one of the display devices 1a shown in FIG. 13 in that the upper surface 24S of the lens 24d and the upper surface 24S of the lens 24e may have different radii of curvature. For example, the radius of curvature of the upper surface 24S of the lens 24d may be greater than the radius of curvature of the upper surface 24S of the lens 24e, but not limited thereto. When the lens 24e is the same as the lens (e.g., the lens 24a shown in FIG. 4) corresponding to the normal region NR, the curvature radius of the upper surface 24S of the lens 24d may be greater than that of the upper surface 24S of the lens 24a. In the embodiment of FIG. 17, the width of the lens 24d may be the same as the width of the lens 24e, but not limited thereto. In some embodiments, the display device 1j of FIG. 17 may adopt the color filter layer 46 of FIG. 14, but not limited thereto. In some embodiments, other parts of the display device 1j shown in FIG. 17 may, for example, adopt one of the display devices of other embodiments mentioned herein or a combination of at least two display devices of other embodiments and are not described redundantly.

Figure 18:
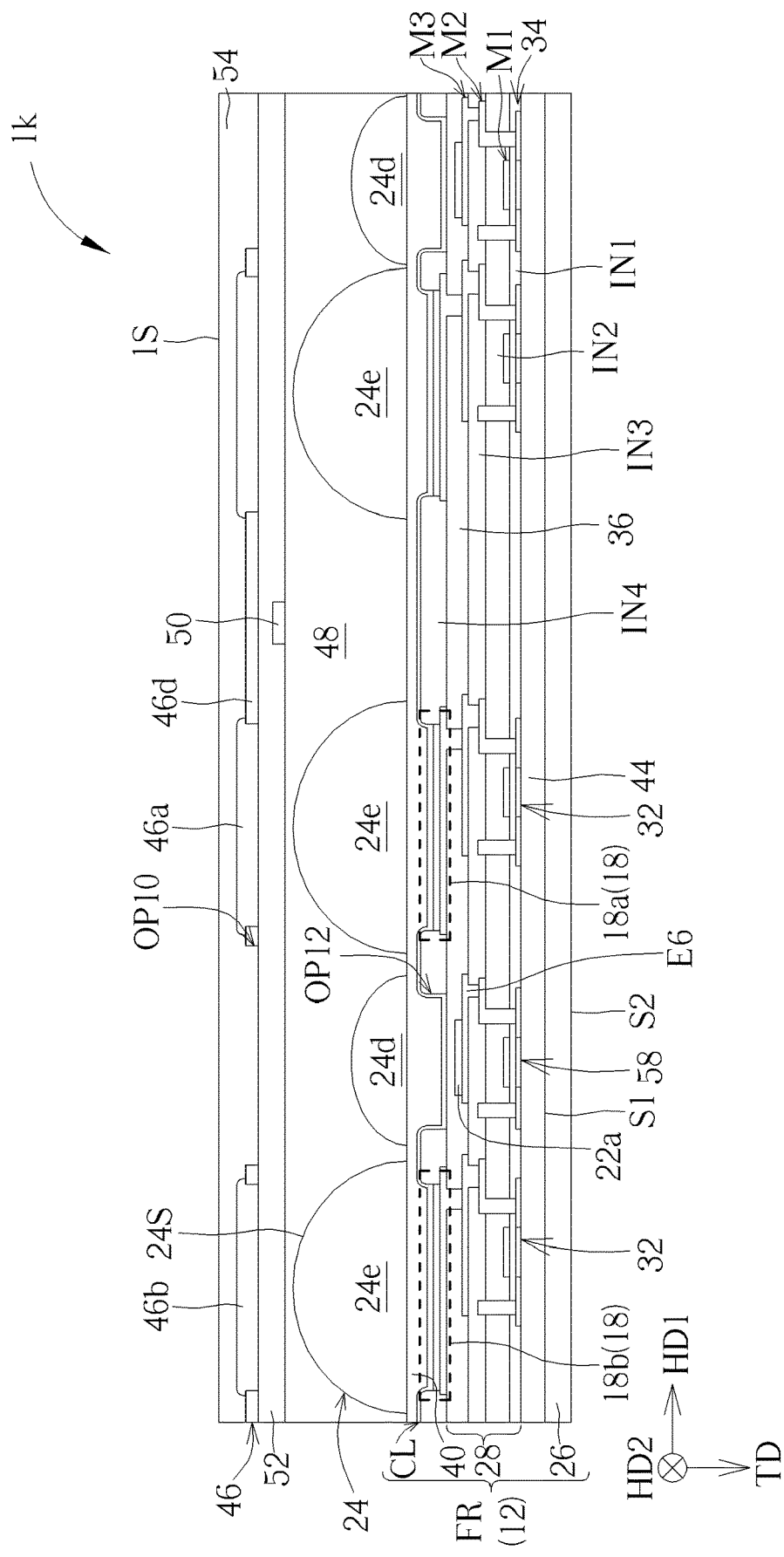
FIG. 18 schematically illustrates a sectional view of a portion of a display device corresponding to a fingerprint sensing region according to another embodiment of the present disclosure.

FIG. 18 schematically illustrates a sectional view of a portion of a display device corresponding to a fingerprint sensing region according to another embodiment of the present disclosure. As shown in FIG. 18, the display device 1k of this embodiment differs from one of the display devices 1a shown in FIG. 13 in that the fingerprint sensing region FR of the display panel 12 may include a plurality of sensing units 22a, and the lens 24d may be overlapped with the sensing units 22a in the top view direction TD. In the embodiment of FIG. 18, the sensing units 22a may be disposed in the circuit layer 28, and the circuit layer 28 may include a plurality of readout elements 58, which are electrically connected to the corresponding sensing units 22a and used for reading the detected signals out. For example, the sensing unit 22a may be disposed between the readout element 58 and the planarization layer 36, but not limited thereto. The readout element 58 and the driving element 32 may be formed by, for example, the same process (e.g., a thin film transistor process). For example, a channel, a source (drain) region and a drain (source) region of the readout element 58 may be formed of the semiconductor layer 34, the gate of the readout element 58 may be formed of the metal layer M1, and the insulating layer IN1 may be used as a gate insulating layer of the readout element 58. In other words, the display panel 12 of this embodiment may, for example, include an embedded fingerprint sensor. Also, the source (drain) region and the drain (source) region of the readout element 58 may be electrically connected to different electrodes, respectively. The readout element 58 of the present disclosure is not limited to the mentioned above and may be adjusted according to requirements. In the embodiment of FIG. 18, the metal layer M3 may, for example, further include an electrode E6 electrically connected to the readout element 58 and the sensing unit 22a, but not limited thereto.

It should be noted that, since the sensing unit 22a may be embedded in the display panel 12, there is no need to dispose the fingerprint sensing module under the display panel 12. In this case, the ambient light will not be reflected by the fingerprint sensing module, so the fingerprint sensing region FR may not need the light shielding layer 30 shown in FIG. 13, but not limited thereto.

In some embodiments, other parts of the display device 1k shown in FIG. 18 may, for example, adopt one of the display devices of other embodiments mentioned herein or a combination of at least two display devices of other embodiments and are not described redundantly.

Figure 19:
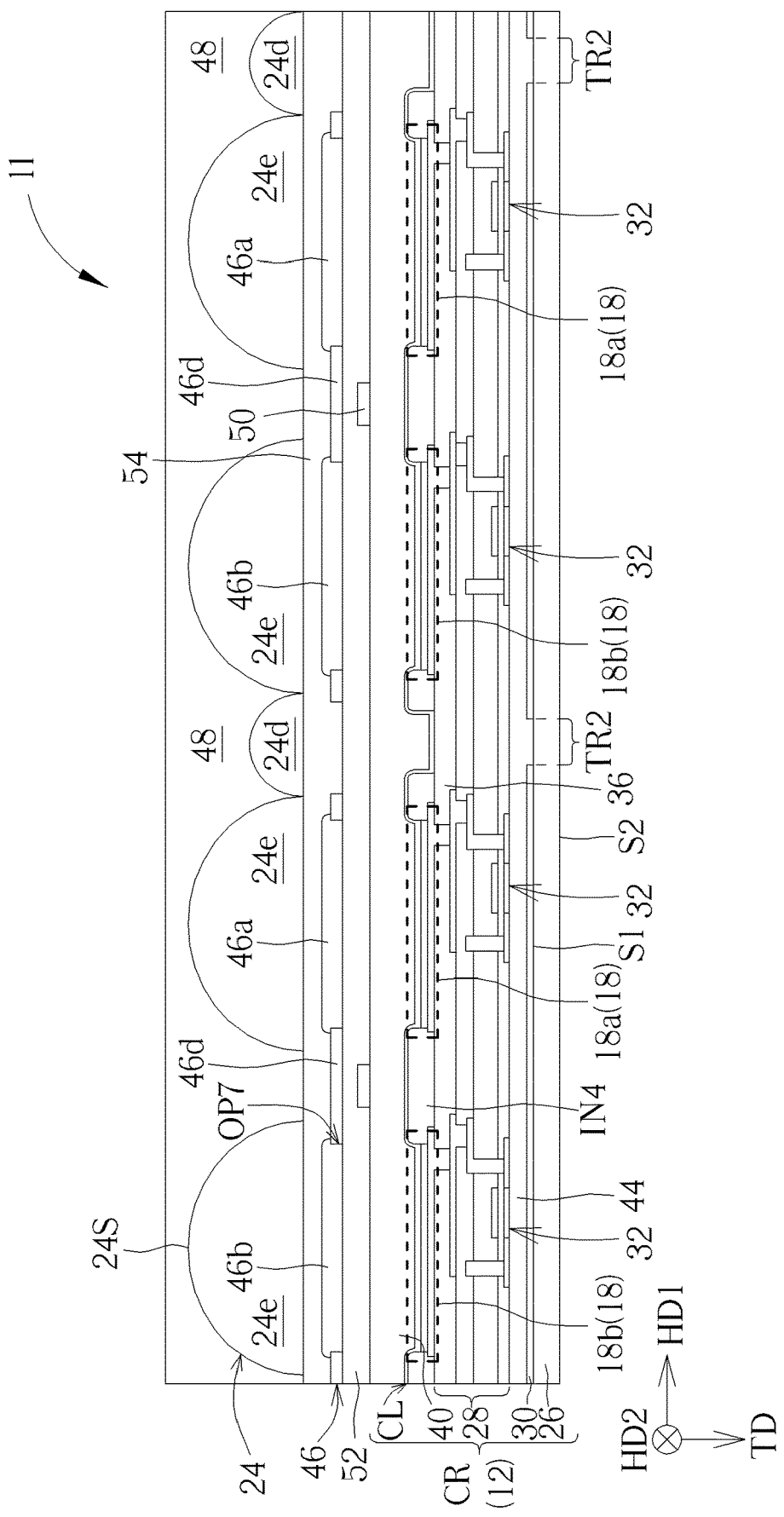
FIG. 19 schematically illustrates a sectional view of a portion of a display device corresponding to a fingerprint sensing region according to another embodiment of the present disclosure.

FIG. 19 schematically illustrates a sectional view of a portion of a display device corresponding to a fingerprint sensing region according to another embodiment of the present disclosure. As shown in FIG. 19, the display device 1l of this embodiment differs from the display device 1a shown in FIG. 13 in that the lens layer 24 may be disposed on the color filter layer 46. In other words, the touch device layer 50 and the insulating layer 52 may be directly disposed on the encapsulation layer 40, but not limited thereto. In some embodiments, other layers may further exist between the touch device layer 50 and the encapsulation layer 40. In addition, in this embodiment, the planarization layer 48 may be optionally disposed on the lens layer 24 to protect the lens layer 24, but not limited thereto. In some embodiments, other parts of the display device 1l shown in FIG. 19 may, for example, adopt one of the display devices of other embodiments mentioned herein or a combination of at least two display devices of other embodiments and are not described redundantly.

In summary, in the display device of the present disclosure, by disposing the transmission areas in the camera region and/or disposing the transmission areas in the fingerprint sensing region, the camera module and/or fingerprint sensing module located under the display panel may detect the required image, and thus, the camera module and/or fingerprint sensing module is able to be integrated into the display region, thereby increasing the screen-to-body ratio of the display device. In addition, by disposing the lens layer on the display panel, when the density of the light emitting elements in the camera region is reduced, the brightness or quality of the image displayed by the display device may be improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
   a display panel having a normal region and a camera region, the normal region comprising a plurality of first light emitting units and the camera region comprising a plurality of second light emitting units; and
   a lens layer disposed on the normal region and the camera region, comprising a plurality of first lenses overlapped with the first light emitting units and a plurality of second lenses overlapped with the second light emitting units;
   wherein a density of the first lenses in the normal region is greater than a density of the second lenses in the camera region.

2. The display device according to claim 1, wherein a width of one of the first lenses is less than a width of one of the second lenses.

3. The display device according to claim 1, wherein the camera region further comprises a plurality of first transmission areas configured to allow a light to pass through, and the lens layer further comprises a plurality of third lenses overlapped with the first transmission areas.

4. The display device according to claim 1, wherein one of the second lenses is overlapped with more than one of the second light emitting units.

5. The display device according to claim 1, wherein the display panel further has a fingerprint sensing region which comprises a plurality of second transmission areas configured to allow a light to pass through, and the lens layer further comprises a plurality of fourth lenses overlapped with the second transmission areas.

6. The display device according to claim 5, wherein a width of one of the fourth lenses is less than a width of one of the first lenses.

7. The display device according to claim 5, wherein a radius of curvature of one of the fourth lens is greater than a radius of curvature of one of the first lenses.

8. The display device according to claim 5, wherein a refractive index of one of the fourth lens is less than a refractive index of one of the first lenses.

9. The display device according to claim 5, further comprising a color filter layer disposed on the lens layer, wherein the color filter layer comprises a plurality of color filter units overlapped with the first light emitting units and the second light emitting units.

10. The display device according to claim 9, wherein the color filter layer further comprises a plurality of openings overlapped with the second transmission areas.

11. The display device according to claim 9, wherein the color filter layer further comprises a plurality of green color filters overlapped with the second transmission areas.

12. The display device according to claim 5, further comprising a fingerprint sensing module disposed under the display panel, wherein the fingerprint sensing module comprises a plurality of sensing units overlapped with the second transmission areas.

13. The display device according to claim 1, wherein the display panel further has a fingerprint sensing region which comprises a plurality of sensing units, and the lens layer further comprises a plurality of third lenses overlapped with the sensing units.

14. The display device according to claim 1, further comprising a camera module disposed under the display panel and overlapped with the camera region.

* * * * *